(12) United States Patent
Xu et al.

(10) Patent No.: US 9,298,437 B2
(45) Date of Patent: *Mar. 29, 2016

(54) UNROLLING QUANTIFICATIONS TO CONTROL IN-DEGREE AND/OR OUT-DEGREE OF AUTOMATON

(71) Applicant: Micron Technology, Inc., Boise, ID (US)

(72) Inventors: Junjuan Xu, San Jose, CA (US); Paul Glendenning, Woodside, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/252,600

(22) Filed: Apr. 14, 2014

(65) Prior Publication Data

US 2014/0229926 A1 Aug. 14, 2014

Related U.S. Application Data

(63) Continuation of application No. 13/357,505, filed on Jan. 24, 2012, now Pat. No. 8,726,256.

(60) Provisional application No. 61/436,051, filed on Jan. 25, 2011.

(51) Int. Cl.
*G06F 9/45* (2006.01)
*G06F 9/44* (2006.01)
*G06F 17/50* (2006.01)

(52) U.S. Cl.
CPC ........ *G06F 8/45* (2013.01); *G06F 8/447* (2013.01); *G06F 9/444* (2013.01); *G06F 17/5054* (2013.01)

(58) Field of Classification Search
None
See application file for complete search history.

(56) References Cited

U.S. PATENT DOCUMENTS

| | | | |
|---|---|---|---|
| 5,081,608 A | 1/1992 | Tamura et al. | |
| 5,537,580 A | 7/1996 | Giomi et al. | |
| 5,729,678 A | 3/1998 | Hunt et al. | |

(Continued)

FOREIGN PATENT DOCUMENTS

| | | |
|---|---|---|
| CN | 1894559 A | 1/2007 |
| CN | 101013452 A | 8/2007 |

(Continued)

OTHER PUBLICATIONS

"AdaBoost Parallelization on PC Clusters with Virtual Shared Memory for Fast Feature Selection", IEEE International Conference on Signal Processing and Communications, (Nov. 2007), 165-168.

(Continued)

*Primary Examiner* — Chuck Kendall
(74) *Attorney, Agent, or Firm* — Schwegman Lundberg & Woessner, P.A.

(57) ABSTRACT

Apparatus, systems, and methods for a compiler are disclosed. One such compiler parses a human readable expression into a syntax tree and converts the syntax tree into an automaton having in-transitions and out-transitions. Converting can include unrolling the quantification as a function of in-degree limitations wherein in-degree limitations includes a limit on the number of transitions into a state of the automaton. The compiler can also convert the automaton into an image for programming a parallel machine, and publishes the image. Additional apparatus, systems, and methods are disclosed.

20 Claims, 17 Drawing Sheets

(56) References Cited

U.S. PATENT DOCUMENTS

| | | | |
|---|---|---|---|
| 5,784,298 | A | 7/1998 | Hershey et al. |
| 5,831,853 | A | 11/1998 | Bobrow et al. |
| 6,262,594 | B1 | 7/2001 | Cheung et al. |
| 6,507,903 | B1 | 1/2003 | Beatty et al. |
| 6,564,336 | B1 | 5/2003 | Majkowski |
| 6,748,588 | B1 | 6/2004 | Fraser et al. |
| 6,832,378 | B1 | 12/2004 | Beatty et al. |
| 7,020,850 | B2 | 3/2006 | Rahhavan et al. |
| 7,039,233 | B2 | 5/2006 | Mori et al. |
| 7,140,018 | B1 | 11/2006 | Beatty et al. |
| 7,170,891 | B2 | 1/2007 | Messenger |
| 7,171,561 | B2 | 1/2007 | Noga |
| 7,392,229 | B2 | 6/2008 | Harris et al. |
| 7,392,409 | B2 | 6/2008 | Tateyama |
| 7,487,131 | B2 | 2/2009 | Harris et al. |
| 7,487,542 | B2 | 2/2009 | Boulanger et al. |
| 7,505,893 | B2 | 3/2009 | Mizutani et al. |
| 7,546,354 | B1 | 6/2009 | Fan et al. |
| 7,693,853 | B2 | 4/2010 | Bellamy et al. |
| 7,761,851 | B2 | 7/2010 | Bailey et al. |
| 7,774,286 | B1 | 8/2010 | Harris |
| 7,917,684 | B2 | 3/2011 | Noyes et al. |
| 7,970,964 | B2 | 6/2011 | Noyes |
| 8,051,022 | B2 | 11/2011 | Pandya |
| 8,065,249 | B1 | 11/2011 | Harris |
| 8,140,780 | B2 | 3/2012 | Noyes |
| 8,601,013 | B2 | 12/2013 | Dlugosch |
| 8,726,253 | B2* | 5/2014 | Glendenning et al. .......... 717/151 |
| 8,726,256 | B2* | 5/2014 | Xu et al. .......... 717/160 |
| 8,788,991 | B2 | 7/2014 | Xu et al. |
| 8,843,911 | B2 | 9/2014 | Xu et al. |
| 2003/0014743 | A1 | 1/2003 | Cooke et al. |
| 2003/0066050 | A1 | 4/2003 | Wang et al. |
| 2003/0145304 | A1 | 7/2003 | Carter |
| 2004/0133869 | A1 | 7/2004 | Sharma |
| 2005/0268258 | A1 | 12/2005 | Decker |
| 2006/0020589 | A1 | 1/2006 | Wu et al. |
| 2007/0005355 | A1 | 1/2007 | Tian et al. |
| 2007/0179639 | A1 | 8/2007 | Sakai |
| 2007/0192110 | A1 | 8/2007 | Mizutani et al. |
| 2007/0296458 | A1 | 12/2007 | Kelem et al. |
| 2008/0140600 | A1 | 6/2008 | Pandya |
| 2008/0141233 | A1 | 6/2008 | Gurevich et al. |
| 2008/0168013 | A1 | 7/2008 | Cadaret |
| 2008/0201281 | A1 | 8/2008 | Graf et al. |
| 2009/0064095 | A1 | 3/2009 | Wallach et al. |
| 2010/0100518 | A1 | 4/2010 | Andrade et al. |
| 2010/0100691 | A1 | 4/2010 | Noyes et al. |
| 2010/0100714 | A1 | 4/2010 | Noyes et al. |
| 2010/0115347 | A1 | 5/2010 | Noyes et al. |
| 2010/0118425 | A1 | 5/2010 | Rafaelof |
| 2010/0121643 | A1 | 5/2010 | Mohajer et al. |
| 2010/0131935 | A1 | 5/2010 | Wang |
| 2010/0138432 | A1 | 6/2010 | Noyes et al. |
| 2010/0138575 | A1 | 6/2010 | Noyes |
| 2010/0138634 | A1 | 6/2010 | Noyes et al. |
| 2010/0138635 | A1 | 6/2010 | Noyes |
| 2010/0169510 | A1 | 7/2010 | Ho et al. |
| 2010/0174887 | A1 | 7/2010 | Pawlowski |
| 2010/0174929 | A1 | 7/2010 | Pawlowski |
| 2010/0175130 | A1 | 7/2010 | Pawlowski |
| 2010/0185647 | A1 | 7/2010 | Noyes |
| 2010/0293153 | A1 | 11/2010 | Zhao et al. |
| 2010/0325633 | A1 | 12/2010 | Eguro et al. |
| 2010/0332809 | A1 | 12/2010 | Noyes et al. |
| 2011/0145182 | A1 | 6/2011 | Dlugosch et al. |
| 2011/0145271 | A1 | 6/2011 | Noyes et al. |
| 2011/0145544 | A1 | 6/2011 | Noyes et al. |
| 2011/0258360 | A1 | 10/2011 | Noyes |
| 2011/0307433 | A1 | 12/2011 | Dlugosch |
| 2011/0307503 | A1 | 12/2011 | Dlugosch |
| 2012/0192163 | A1* | 7/2012 | Glendenning et al. .......... 717/143 |
| 2012/0192164 | A1 | 7/2012 | Xu et al. |
| 2012/0192165 | A1 | 7/2012 | Xu et al. |
| 2012/0192166 | A1 | 7/2012 | Xu et al. |
| 2014/0082009 | A1 | 3/2014 | Dlugosch |
| 2014/0229925 | A1 | 8/2014 | Glendenning et al. |
| 2014/0380288 | A1 | 12/2014 | Xu et al. |
| 2015/0046889 | A1 | 2/2015 | Xu et al. |

FOREIGN PATENT DOCUMENTS

| | | | |
|---|---|---|---|
| CN | 101339501 | A | 1/2009 |
| CN | 101360088 | A | 2/2009 |
| CN | 101499065 | A | 8/2009 |
| CN | 101099147 | B | 5/2010 |
| CN | 103003792 | A | 3/2013 |
| CN | 103430148 | A | 12/2013 |
| CN | 103443767 | A | 12/2013 |
| CN | 103547998 | A | 1/2014 |
| CN | 103547999 | A | 1/2014 |
| EP | 2184687 | A1 | 5/2010 |
| JP | 04291662 | A | 10/1992 |
| JP | 2002358500 | A | 12/2002 |
| JP | 2005122466 | A | 5/2005 |
| TW | 401558 | B | 8/2000 |
| TW | 505854 | B | 10/2002 |
| TW | 505855 | B | 10/2002 |
| TW | 505856 | B | 10/2002 |
| TW | 200301420 | A | 7/2003 |
| TW | 556065 | B | 10/2003 |
| TW | 200412724 | A | 7/2004 |
| TW | I307030 | B | 3/2009 |
| TW | 201025011 | A | 7/2010 |
| TW | 201237748 | A | 9/2012 |
| TW | 201239765 | A | 10/2012 |
| TW | 201246071 | A | 11/2012 |
| TW | 201246081 | A | 11/2012 |
| WO | WO-2009029698 | A1 | 3/2009 |
| WO | WO-2011156634 | A2 | 12/2011 |
| WO | WO-2011156634 | A3 | 12/2011 |
| WO | WO-2012103143 | A2 | 8/2012 |
| WO | WO-2012103146 | A2 | 8/2012 |
| WO | WO-2012103148 | A2 | 8/2012 |
| WO | WO-2012103151 | A2 | 8/2012 |

OTHER PUBLICATIONS

"Chinese Application Serial No. 201180034987.3 Response filed Dec. 19, 2014 to Non-Final Office Action mailed Oct. 8, 2014", W/ English claims, 21 pgs.

"Chinese Application Serial No. 201280013925.9 Response filed Mar. 6, 2015 to Office Action mailed Dec. 22, 2014", W/ English Claims, 3 pgs.

"Chinese Application Serial No. 201280013925.9, Office Action mailed Dec. 22, 2014", W/ English Translation, 4 pgs.

"Japanese Application Serial No., 2013-550670 Office Action mailed Mar. 17, 2015", W/ English Translation, 6 pgs.

"Japanese Application Serial No. 2013-514372 Response filed Mar. 5, 2015 to Office Action mailed Aug. 5, 2014", With the English claims, 17 pgs.

"Japanese Application Serial No. 2013-514372, Response filed Mar. 5, 2015 to Final Office Action mailed Dec. 9, 2014", W/ English Claims, 17 pgs.

"Japanese Application Serial No. 2013-550669, Notice of Rejection mailed Mar. 17, 2015", with English Translation, 7 pgs.

"Japanese Application Serial No. 2013-550671, Amendment filed Jan. 22, 2015", W/ English Claims, 7 pgs.

"Japanese Application Serial No. 2013-550672, Preliminary Amendment filed on Jan. 22, 2015", W/ English Claims, 17 pgs.

"Taiwan Application Serial No. 100120418 Response filed Apr. 10, 2015 to Office Action mailed Feb. 5, 2015", W/ English Claims, 5 pgs.

"Taiwanese Application Serial No. 100120418, Office Action mailed Jan. 12, 2015", W/ English Translation, 28 pgs.

Polikar, R, "Ensemble Based Systems in Decision Making", IEEE Circuits and Systems Magazine, vol. 6, No. 3, (2006), 21-45.

Shinya, Ryoma, et al., "Implementation of Regular Expression Engine with Dynamic Code Generation.", Information Processing Society 52nd Programming Symposium, W/ Machine Translation, 22 pgs.

(56) References Cited

OTHER PUBLICATIONS

"Chinese Application Serial No. 201180034987.3, Office Action mailed Mar. 25, 2015", W/ English Tranlations, 17 pgs.
"Chinese Application Serial No. 201280013925.9, Office Action mailed May 18, 2015", W/ English Translation, 4 pgs.
"Japanese Application Serial No. 2013-550670 Response filed Jun. 11, 2015 to Office Action mailed Mar. 17, 2015", W/ English claims, 30 pgs.
"Japanese Application Serial No. 2013-550670, Preliminary Amendment filed Jan. 22, 2015", W/ English Claims.
"Korean Application Serial No. 10-2013-7021925, Amendment filed Jun. 12, 2015", W/ English claims, 38 pgs.
"Korean Application Serial No. 10-2013-7022037, Amendment filed Jun. 11, 2015", W/ English claims.
"Korean Application Serial No. 10-2013-7022299, Amendment filed Jun. 12, 2015", W/ English claims, 36 pgs.
"Korean Application Serial No. 10-2013-7022309, Amendment filed Jun. 11, 2015", W/ English claims.
"Taiwanese Application Serial No. 100120418, Decision of Rejection mailed May 20, 2015", W/ English Translation, 12 pgs.
"Taiwanese Application Serial No. 101102912, Office Action mailed Mar. 27, 2015", W/ English Translation, 6 pgs.
"Taiwanese Application Serial No. 101102988, Office Action mailed Apr. 7, 2015", W/ English Translation, 8 pgs.
"Taiwanese Application Serial No. 101102989, Office Action mailed May 27, 2015", W/ English Translation, 7 pgs.
"Chinese Application Serial No. 201280013925.9, Amendment filed Jan. 26, 2014", w/English Claims, 13 pgs.
"Chinese Application Serial No. 201280013925.9, Office Action mailed Mar. 3, 2014", w/English Translation, 10 pgs.
Li, Lin, "On Algebraic Properties of State Machines", Master's Thesis—Guangxi Normal University, (Jan. 1, 2007), 31-34.
"International Application Serial No. PCT/US2011/039849, International Preliminary Report on Patentability mailed Dec. 20, 2012", 6 pgs.
"International Application Serial No. PCT/US2011/039849, International Search Report mailed Feb. 9, 2012", 3 pgs.
"International Application Serial No. PCT/US2011/039849, Written Opinion mailed Feb. 9, 2012", 4 pgs.
"International Application Serial No. PCT/US2012/022441, International Preliminary Report on Patentability mailed Aug. 8, 2013", 6 pgs.
International Application Serial No. PCT/US2012/022441, Search Report mailed Aug. 31, 2012,3 pgs.
"International Application Serial No. PCT/US2012/022441, Written Opinion mailed Aug. 31, 2012", 4 pgs.
Mitra, Abhishek, et al., "Compiling PCRE to FPGA for Accelerating SNORT IDS", ACM/IEEE Symposium on Architectures for Networking and Communications Systems, (Dec. 2007), 9 pgs.
Vasiliadis, Giorgos, et al., "Regular Expression Matching on Graphics Hardware for Intrusion Detection", Proceedings of the 12th International Symposium on Recent Advances in Intrusion Detection, See pp. 267-270, 272-274, (2009), 265-283.
Yang, Jeehong, et al., "An Approach to Graph and Netlist Compression", Data Compression Conference, [Online]. Retrieved from the Internet: <URL: http://comparch.doc.ic.ac.uk/publications/files/Jeehong08Dcc08.pdf>, (2008), 33-42.
Zhang, C, et al., "Intrusion Detection Using Hierarchical Neural Networks", Pattern Recognition Letters, 26(6), (May 1, 2005), 779-791.
"Chinese Application Serial No. 10756723.2, Amendment filed Aug. 22, 2013", w/English Claims, 18 pgs.
"Chinese Application Serial No. 201180034987.3, Office Action mailed Mar. 3, 2014", w/English Translation, 21 pgs.
"Chinese Application Serial No. 201180034987.3, Office Action mailed Oct. 8, 2014", W/ English Translation, 18 pgs.
"Chinese Application Serial No. 201180034987.3, Response filed Jul. 17, 2014 to Office Action mailed Mar. 4, 2014", W/ English Claims, 4 pgs.
"Chinese Application Serial No. 201280012402.2, Amendment filed Jan. 16, 2014", W/ English Claims, 18 pgs.
"Chinese Application Serial No. 201280013903.2, Voluntary Amendment filed May 8, 2014", W/ English Translation, 27 pgs.
"Chinese Application Serial No. 201280013925.9 Response Filed Oct. 23, 2014 Non-Final Office Action Mailed Sep. 23, 2014", With the English claims, 19 pgs.
"Chinese Application Serial No. 201280013925.9, Office Action mailed Aug. 8, 2014", W/ English Translation, 13 pgs.
"Chinese Application Serial No. 201280013925.9, Response filed Jul. 16, 2014 to Office Action mailed Mar. 3, 2014", W/ English Claims, 14 pgs.
"European Application Serial No. 11793185.7, Amendment field Sep. 3, 2013", 7 pgs.
"European Application Serial No. 12739387.4, Extended European Search Report mailed May 27, 2014", 8 pgs.
"European Application Serial No. 12739387.4, Office Action mailed Sep. 13, 2013", 2 pgs.
"European Application Serial No. 12739387.4, Response filed Mar. 21, 2014 to Office Action mailed Sep. 13, 2013", 12 pgs.
"European Application Serial No. 12739387.4, Response filed Nov. 27, 2014 to Extended European Search Report mailed May 27, 2014", 11 pgs.
"European Application Serial No. 12739626.5, Extended European Search Report mailed Jun. 18, 2014", 7 pgs.
"European Application Serial No. 12739626.5, Office Action mailed Sep. 17, 2013", 2 pgs.
"European Application Serial No. 12739626.5, Response filed Mar. 21, 2014 to Office Action mailed Sep. 17, 2013", 10 pgs.
"European Application Serial No. 12739626.5, Response filed Dec. 11, 2014 to European Extended Search Report mailed Jun. 18, 2014", 11 pgs.
"European Application Serial No. 12739650.5, Office Action mailed Sep. 13, 2013", 2 pgs.
"European Application Serial No. 12739650.5, Response filed Mar. 21, 2014 to Office Action mailed Sep. 13, 2013", 12 pgs.
"European Application Serial No. 12739652.1, Office Action mailed Sep. 13, 2013", 2 pgs.
"European Application Serial No. 12739652.1, Response filed Mar. 21, 2014 to Office Action mailed Sep. 13, 2013", 8 pgs.
"International Application Serial No. PCT/US2012/022435, International Preliminary Report on Patentability mailed Aug. 8, 2013", 8 pgs.
"International Application Serial No. PCT/US2012/022435, Search Report mailed Aug. 31, 2012", 3 pgs.
"International Application Serial No. PCT/US2012/022435, Written Opinion mailed Aug. 31, 2012", 6 pgs.
"International Application Serial No. PCT/US2012/022439, International Preliminary Report on Patentability mailed Aug. 8, 2013", 6 pgs.
"International Application Serial No. PCT/US2012/022439, Search Report mailed Sep. 10, 2012", 3 pgs.
"International Application Serial No. PCT/US2012/022439, Written Opinion mailed Sep. 10, 2012", 4 pgs.
"International Application Serial No. PCT/US2012/022441, Written Opinion mailed Aug. 31, 2012", 3 pgs.
"International Application Serial No. PCT/US2012/022444, International Preliminary Report on Patentability mailed Aug. 8, 2013", 5 pgs.
"International Application Serial No. PCT/US2012/022444, Search Report mailed Aug. 31, 2012", 3 pgs.
"Japanese Application Serial No. 2013-514372 Response Filed Nov. 4, 2014 to Non-Final Office Action mailed Aug. 5, 2014", With the English claims, 19 pgs.
"Japanese Application Serial No. 2013-514372, Office Action mailed Aug. 5, 2014", W/ English Translation, 12 pgs.
"Taiwan Application Serial No. 100120418 Response Filed Nov. 11, 2014 to Non-Final Office Action Mailed Aug. 11, 2014", With the English claims, 46 pgs.
"Taiwanese Application Serial No. 100120418, Office Action mailed Aug. 11, 2014", W/ English Translation, 6 pgs.
Badii, Atta, et al., "Efficient FPGA-based regular expression pattern matching", European and Mediterranean Conference on Information

(56) References Cited

OTHER PUBLICATIONS

Systems A1 Bustan Rotana Hotel, [Online]. Retrieved from the Internet: <http://www.researchgate.net/publication/228810333_Efficient_FPGA_based_regular_expression_pattern_matching/file/9fcfd50e5e78229189.pdf>, (Mar. 25, 2008), 1-12.

Sidhu, Reetinder, et al., "Fast Regular Expression Matching using FPGAs", IEEE Symposium on Field Programmable Custom Computing Machines (FCCM 2001), (Apr. 2001), 227-238.

Vassilios, Karakoidas, et al., "FIRE/J Optimizing Regular Expression Searches With Generative Programming", Software Practice & Experience, Wiley & Sons, vol. 38, No. 6, (Jul. 23, 2007), 557-573.

Yang, Yi-Hua E, et al., "Compact Architecture for High-Throughput regular expression matching on FPGA", Architectures for Networking and Communications Systems; 20081106-20081107, (Nov. 6, 2008), 30-39.

"Chinese Application Serial No. 201180034987.3, Office Action mailed Sep. 6, 2015", W/ English Translation, 6 pgs.

European Application Serial No. 12739652.1, Extended European Search Report mailed Oct. 15, 2015, 11 pgs.

"Korean Application Serial No. 10-2013-7022037, Notice of Preliminary Rejection mailed Aug. 28, 2015", W/ English Translation, 6 pgs.

"Korean Application Serial No. 10-2013-7022299, Notice of Preliminary Rejection mailed Aug. 21, 2015", W/ English Translation, 7 pgs.

"Korean Application Serial No. 10-2013-7022309, Office Action mailed Oct. 2, 2015", W/ English Translation, 6 pgs.

Davide, Pasetto, et al., "DotStar: breaking the scalability and performance barriers in parsing regular expressions", Computer Science—Research And Development; Computer Science—Research And Development Organ Der Fachbereiche Softwaretechnik, Datenbanken Und Informationssysteme Der Gesellschaft F Prg A [1/4]R Informatik E.V. (GI), Springer-Verlag, Berlin/Heidelb, Voi, (Apr. 2, 2010), 93-104.

Le, Hoang Long, et al., "Enhanced FPGA-based architecture for regular expression matching in NIDS", Electrical Engineering/Electronics Computer Telecommunications And Information Technology (ECTI-CON), 2010 International Conference on, IEEE, Piscataway, NJ, USA, (May 19, 2010), 666-670.

Michela, Becchi, et al., "Extending finite automata to efficiently match Perl-compatible regular expressions", Proceedings Of The 2008 Acm Conext Conference On, Conext '08 New York, New York, USA, (Jan. 1, 2008), 1-12.

European Application Serial No. 11793185.7, Extended European Search Report mailed Jul. 6, 2015, 7 pgs.

"Taiwanese Application Serial No. 101102956, Office Action mailed Jun. 23, 2015", W/ English Search Report, 5 pgs.

Bishop, Christopher, "The Multi-Layer Perceptron In: Neural Networks for Pattern Recognition", Oxford University Press, (Dec. 31, 1995), 116-160.

Neveu, J N P, et al., "Implementation of the neocognitron on a SIMD architecture", Intelligent Information Systems, (Nov. 29, 1994), 179-183.

Vasconcelos, G C, et al., "Efficient Detection of Spurious Inputs for Improving the Robustness of MLP Networks in Practical Applications", Neural Computing and Applications, Springer-Verlag Lo, vol. 3, No. 4, (Jan. 1, 1995), 202-212.

\* cited by examiner

1

UNROLLING QUANTIFICATIONS TO CONTROL IN-DEGREE AND/OR OUT-DEGREE OF AUTOMATON

CLAIM OF PRIORITY

This patent application is a continuation of U.S. application Ser. No. 13/357,505, filed Jan. 24, 2012 and now issued as U.S. Pat. No. 8,726,256, which claims the benefit of priority, under 35 U.S.C. Section 119(e), to U.S. Provisional Patent Application Ser. No. 61/436,051, titled "UNROLLING QUANTIFICATIONS TO CONTROL IN-DEGREE AND/OR OUT DEGREE OF AUTOMATON," filed on Jan. 25, 2011, all of which are hereby incorporated by reference herein in their entirety.

BACKGROUND

A finite state machine (FSM) (also referred to as a finite-state automaton, automaton, or simply a state machine) is a representation of states, transitions between states and actions. A finite state machine can be used to design digital logic, computer programs, or images for a parallel machine. A finite state machine is a model of behavior composed of a finite number of states, transitions between those states, and outputs. A finite state machine can be represented as a graph where the vertices of the graph correspond to states of the finite state machine and the edges of the graph correspond to transitions between states which occur due to one or more inputs to the finite state machine. Finite state machines can also have probabilistic transitions, fuzzy states, or other oddities. A finite state machine has a finite internal memory, an input feature, and an optional output feature. Finite state machines with an output can be referred to as finite state transducers.

Applications of finite state machines include electronic design automation, communication protocol design, biology and artificial intelligence research, and linguistics to describe the grammars of natural languages.

DETAILED DESCRIPTION

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

This document describes, among other things, a compiler that converts source code into a machine code implementation of a finite state machine. The machine code can correspond to a target device, in that the machine code is configured to implement the functions described by the source code on the target device. In an example, the target device is a parallel machine and the machine code comprises an image for the parallel machine. In another example, the target device comprises a computer having a Von Neumann architecture, and the machine code comprises instructions for execution by a processor in the computer.

In any case, the compiler converts the source code into a finite state machine embodying the functions described by the source code. In the process of compiling the source code, the compiler converts the source code into an automaton. Using the automaton, the compiler can identify and combine redundancies in the source code in order to optimize the resultant finite state machine implemented in the machine code. Additionally, the compiler can take into account aspects or limitations of the target device when forming the automaton in order to reduce complexity of the resultant machine code and increase the efficiency of operation of the target device.

Figure 1:
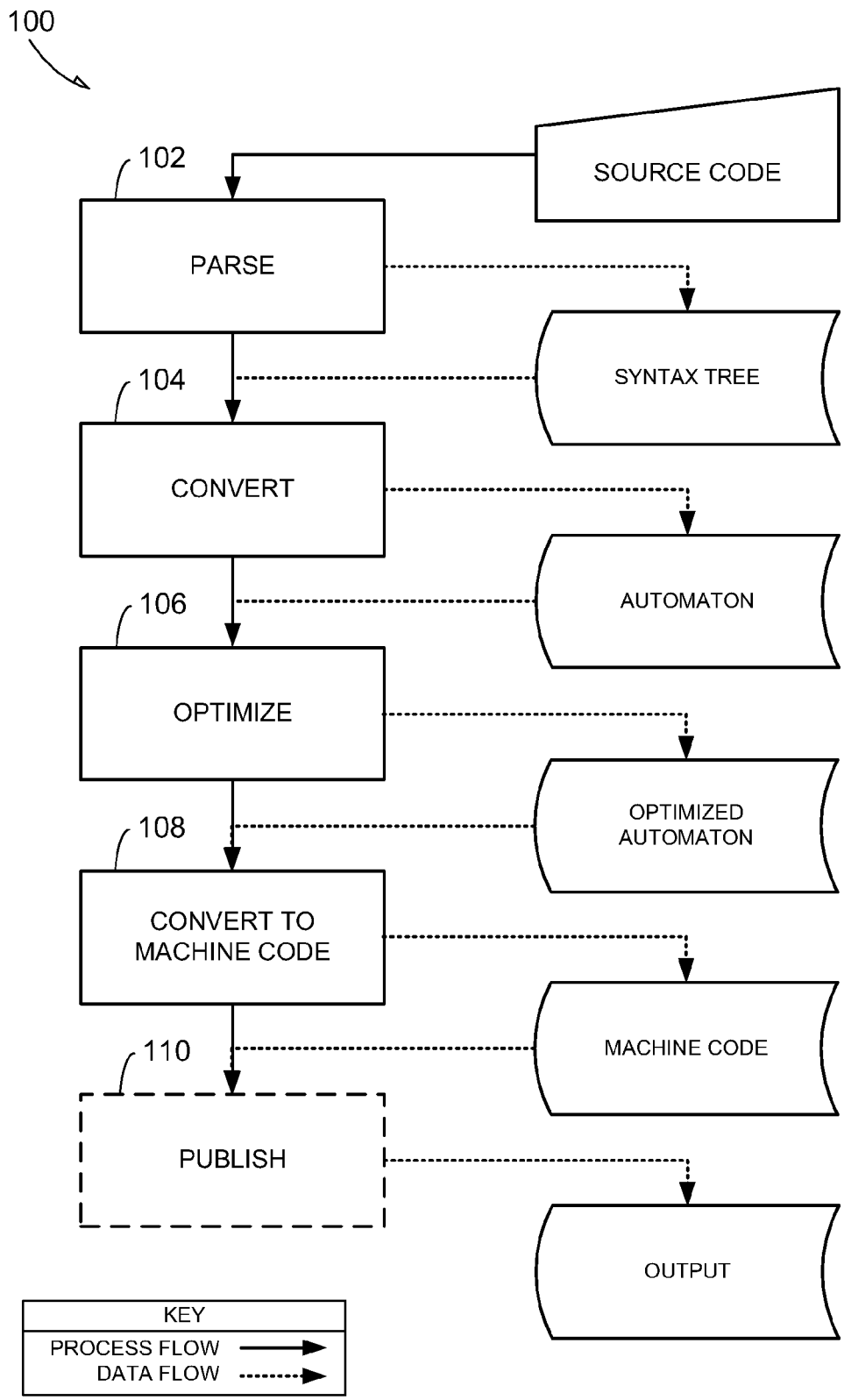
FIG. 1 illustrates an example of a flow chart for a compiler that can convert source code into machine code using an automaton according to various embodiments of the invention.

FIG. 1 illustrates a flow chart 100 for an example compiler. The compiler takes source code as an input and generates machine code to implement the functions described by the source code on a target device. In one example, the target device comprises a parallel machine as described below with respect to FIGS. 5-9. The parallel machine includes a plurality of programmable elements that can be set into one of a plurality of states. Machine code for a parallel machine comprises an image for setting the state of one or more of the programmable elements. In another example, the target device is a computer having a Von Nuemann architecture. The computer includes one or more processors coupled to one or more memory devices having software thereon for execution by the one or more processors. Machine code for a Von Nuemann architecture comprises instructions for execution by the one or more processors. An example computer having a Von Nuemann architecture is described below with respect to FIG. 15. In any case, the compiler generates machine code by using an automaton as an intermediary conversion. The compiler uses an automaton in order to, among other things, optimize the resultant FSM and, in turn, optimize the machine code.

In an example, the source code describes search strings for identifying patterns of symbols within a group of symbols. To describe the search strings, the source code can include a plurality of regular expressions (regexs). A regex can be a string for describing a symbol search pattern. Regexes are widely used in various computer domains, such as programming languages, text editors, network security, and others. In an example, the regular expressions supported by the compiler include search criteria for the search of unstructured data. Unstructured data can include data that is free form and has no indexing applied to words within the data. Words can include any combination of bytes, printable and non-printable, within the data. In an example, the compiler can support multiple different source code languages for implementing regexes including Perl, (e.g., Perl compatible regular expressions (PCRE)), PHP, Java, and .NET languages.

Referring back to FIG. 1, at block 102 the compiler can parse the source code to form an arrangement of relationally connected operators. Parsing source code can create a generic representation of the source code. In an example, the generic representation comprises an encoded representation of the regexs in the source code in the form of a tree graph known as a syntax tree. The examples described herein refer to the arrangement as a syntax tree (also known as an "abstract syntax tree") in other examples, however, a concrete syntax tree or other arrangement can be used.

Since, as mentioned above, the compiler can support multiple languages of source code, parsing converts the source code, regardless of the language, into a non-language specific representation, e.g., a syntax tree. Thus, further processing (blocks 104, 106, 108, 110) by the compiler can work from a common input structure regardless of the language of the source code.

The syntax tree includes a plurality of operators that are relationally connected. The syntax tree can include multiple different types of operators, where different types of operators correspond to different functions implemented by the source code. That is, different operators can correspond to different functions implemented by the regexes in the source code.

At block 104, the syntax tree is converted into an automaton. An automaton comprises a software model of a FSM and can accordingly be classified as deterministic or non-deterministic. A deterministic automaton has a single path of execution at a given time, while a non-deterministic automaton has multiple concurrent paths of execution. The automaton comprises a plurality of states. In order to convert the syntax tree into an automaton, the operators and relationships between the operators in the syntax tree are converted into states with transitions between the states.

In order to effectively utilize the elements of the target device, the compiler can form the automaton based on aspects or limitations of the elements of the target device. For example, the elements may have certain restrictions on the number of transitions into or out of a given state in the automaton. In other examples, hard restrictions may not be present, but the compiler may limit the number of transitions into or out of a given state in order to simplify the processing required by the compiler to generate the machine code and/or to improve the efficiency of operation of the machine code on the target device. More detail on limiting the transitions into or out of a given state is provided below with respect to FIGS. 3 and 4A-4C.

Once the automaton has been formed, at block 106, the automaton can be optimized to, among other things, reduce its complexity and size. The automaton can be optimized by combining equivalent states, among other things.

At block 108, the automaton is converted into machine code for a target device. In one example, the machine code comprises executable instructions for a processor in a Von Nuemann architecture. Here, the machine code can comprise an executable program. In another example, the machine code can comprise bits configured to program the hardware elements in a parallel machine. Here, the machine code can comprise an image for loading onto the parallel machine.

At block 110, the machine code can be published by the compiler. In an example, the machine code can be published by saving the machine code to a computer readable medium. In another example, the machine code can be published by sending the machine code to another device, such as a loader for loading the machine code onto a parallel machine. In yet another example, the machine code can be published by loading the machine code onto a parallel machine. In still another example, the machine code can be published by displaying the machine code on a display device.

Figure 15:
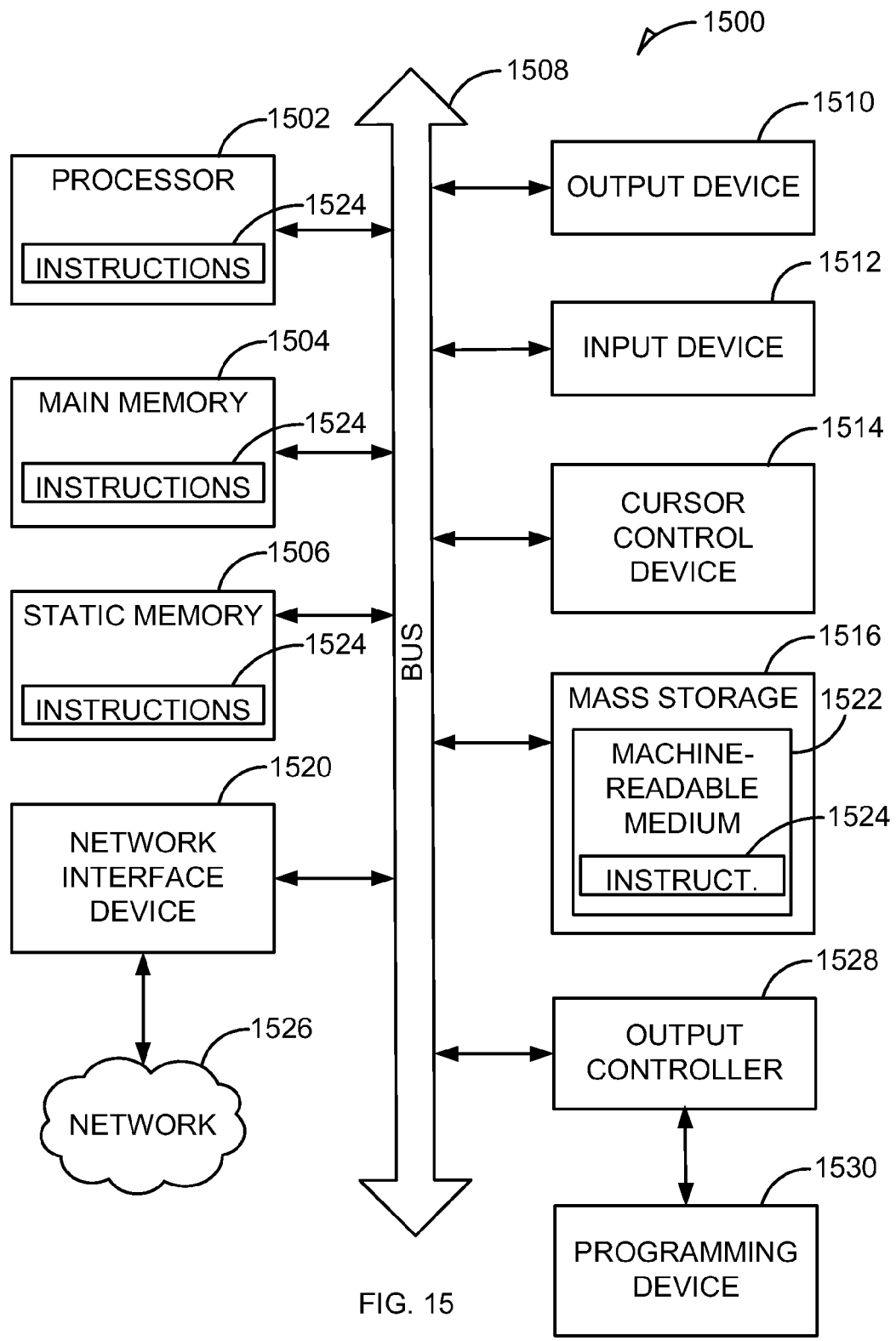
FIG. 15 illustrates an example of a computer, according to various embodiments of the invention.

In an example, the compiler can be implemented by instructions for a computer having a Von Nuemann architecture. These instructions can cause a processor on the computer to implement the functions of the compiler. For example, the instructions, when executed by the processor, can cause the processor to perform actions as described in blocks 102, 104, 106, 108, and 110 on source code that is accessible to the processor. An example computer having a Von Nuemann architecture is shown in FIG. 15 and described below.

One type of regex that can be described in the source code includes a quantification. Quantifications are well known in the art, and are used to describe repeated patterns. As an example, "A(B){n1, n2}C" is a general regular expression, where A, B and C are sub-expressions, and "(B){n1, n2}" comprises a quantification. As described herein, upper-case letters are used to represent regular expressions or a portion of a regular expression (e.g., a sub-expression). Double quotation marks may be added around regular expressions or sub-expressions to avoid confusion. Accordingly, an upper-case letter describing an expression can correspond to a search string for multiple input symbols. For example, the expression "A" can correspond to the input string 'abbc'.

Moreover, it should be understood that the terms expression and sub-expression are used herein for relational description only (e.g., a sub-expression is a portion of an expression), and that the terms expression and sub-expression should not be limited to any specific length, syntax, or number of characters. In particular, source code can include a large number of characters (including metacharacters and search characters) of which the entire set of characters or any individual portion thereof can be considered an "expression". For example, each of the following can be considered an expression "a(bb|d?){5, 20}c", "(b){0, 10}", "(b|d)", and "b".

A quantification is expressed in regex as "(B){n1, n2}", where B is a sub-expression, and n1 and n2 are integers specifying how many times the preceding sub-expression is allowed to occur. B is referred to herein as a repeated sub-expression since B is a sub-expression that is repeated the number of times specified by n1 and n2. To match the quantification "(B){n1, n2}", the repeated sub-expression B must be matched from n1 to n2 number of times. For example, the regex "(B){5, 7}" would require the sub-expression B to be matched 5, 6, or 7 times. In the regex "A(B){n1, n2}C", the sub-expression A is referred to herein as a drive expression, since the sub-expression A, when matched, transitions to a quantification. Additionally, to continue repeating and incrementing the count for the quantification, the repeated sub-expression(s) of the quantification must be matched consecutively. That is, when a repeated sub-expression is not matched during a given loop of the quantification, the quantification ends. In an example, the symbol '?' also corresponds to quantification, where the symbol preceding the '?' can be identified either one or zero times.

Figure 2:
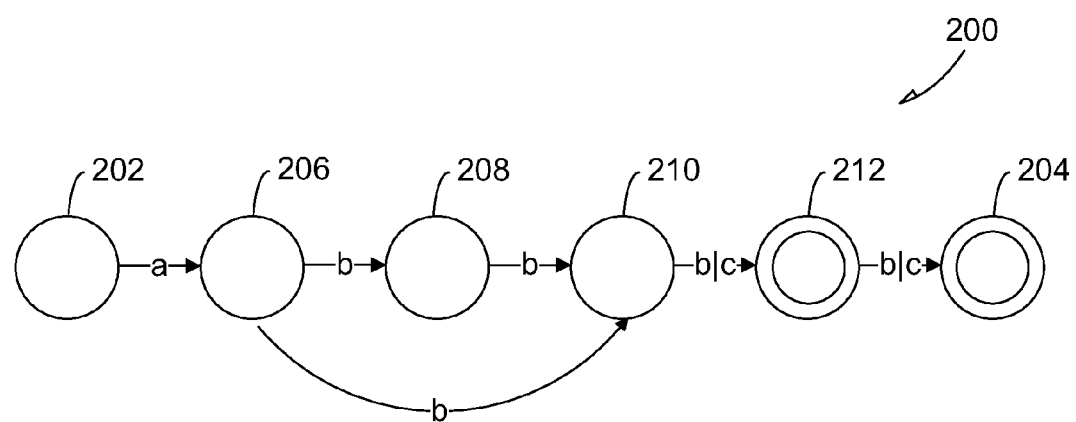
FIG. 2 illustrates an example of an automaton used by the compiler according to various embodiments of the invention.

FIG. 2 illustrates an example automaton 200 corresponding to a regex having a quantification. The automaton 200 corresponds to the regex "abb?(b|c){1, 2}". The automaton 200 includes an initial state 202 and final states 212, 204. The final states 212, 204 are identified in FIG. 2 as double circles. The initial state 202 is initially activated and transitions to state 206 upon the input symbol 'a'. State 206 transitions to both state 208 and state 210 on the input symbol 'b'. State 208 transitions to state 210 on the input symbol 'b', and state 210 transitions to state 212 on either the input symbol 'b' or 'c'. Likewise, the automaton 200 transitions from state 212 to state 204 on either the input symbol 'b' or 'c'. States 212 and 204 are identified as final states since activation of either state 212 or state 204 indicates a match of the regex "abb?(b|c){1, 2}" to which the automaton 200 corresponds.

Figure 3:
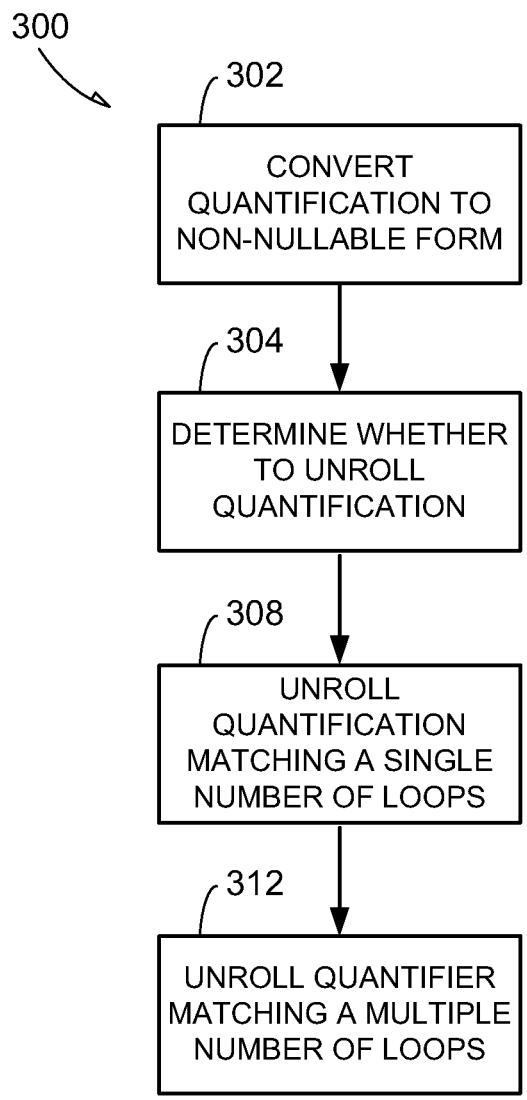
FIG. 3 illustrates an example of a method for unrolling a quantification according to various embodiments of the invention.

FIG. 3 illustrates an example of a method 300 for converting a syntax tree into an automaton. In particular, method 300 illustrates a means for converting a quantification operator (also referred to herein as simply a "quantification") into an automaton by unrolling the quantification. Unrolling a quantification can include, for example, rewriting the quantification with non-quantification syntax and converting the non-quantification syntax into an automaton. For example, "(b|c){1, 2}" can be rewritten as "(b|c)(b|c)?". The merits of unrolling can include that the resultant automaton is a directed acyclic graph (DAG), which can be easier to implement in a target device.

Method 300 begins at block 302 where a quantification is converted to a non-nullable form when a repeated sub-expression of the quantification is nullable. If the repeated sub-expression is not nullable, the method proceeds to 304 without converting the quantification. An expression is nullable when the expression can be matched by an empty string. For example, the expression (b|c) can be matched by either the input symbols 'bc' OR an empty string. Accordingly, the expression (b|c) is nullable since the expression can be matched by an empty string. To convert a quantification corresponding to a nullable repeated sub-expression to a quantification having a non-nullable repeated sub-expression, the nullable portion of the repeated sub-expression is removed. For example, the expression (b|c) becomes (bc). In addition, the number of loops to match the quantification is modified from {n1, n2} to {0, n2}. For example, the expression "AB{n1, n2}C" is converted to "AB'{0, n2}C", where B' is the non-nullable form of B. In an example, the quantification "a(b|c){3, 5}d" can be converted to "a(bc){0, 5}d".

In an example, at block 304 it is optionally determined whether the quantification is to be unrolled. As mentioned above, unrolling a quantification can include rewriting the quantification with non-quantification syntax and converting the non-quantification syntax into an automaton. A consequence of this rewriting of the quantification is that the resulting unrolled syntax is implemented with general purpose states (e.g., state machine elements) and not special purpose states (e.g., counters). In some situations, however, it may be desirable to implement the quantification with special purpose elements (e.g., a counter) and thus, to not unroll the quantification. In other instances, the quantification is unrolled. When the quantification is not unrolled, method 300 ends for that quantification. When the quantification can be unrolled at least in part, method 300 continues to block 306. The following conditions indicate an example of when can possibly be implemented with a counter and when a quantification is not to be implemented with a counter and is unrolled. It should be understood that although certain situations below are described as being possibly implemented by a counter, in other examples these situations may be implemented by unrolling. In general, all quantifications can be implemented by unrolling if desired.

Before determining whether a counter can be used to implement a quantification, if £(B) includes empty string, the quantification of "B{n1, n2}" is rewritten as "B'{0, n2}", where B' is the no-empty-string version of B, £(B')=£(B)−Φ. For example, "(bc|){10, 20}" can be rewritten to "(bc){0, 20}", since these regexes accept the exact same data.

1. When (n1=0, n2=−1), the quantification is to be implemented by unrolling. Here, no counter is needed.
2. When (n1=1, n2=−1), the quantification is to be implemented by unrolling. Here, no counter is needed.
3. When (n1>1, n2=−1), the quantification is to be split into two regexes B{n1−1} and B+, since B{n, −1} equals B{n1−1}B+. The quantification B{n1−1} can then possibly be implemented with a counter while B+ is to be implemented by unrolling.
4. When (n1=0, n2>0), the quantification is to be modified to (B{1, n2})? since (B{1, n2})? equals B{0, n2}. The non-nullable B{1, n2} can then possibly be implemented with a counter.
5. When (n1>0, n2>0), the quantification can possibly be implemented as B{n1, n2} with a counter.

In a summary, a quantification that can be possibly be implemented with a counter without modification can be written as B{n1, n2}, where B is not nullable, n1>0, n2>0, and n1≤n2.

At block 306, a quantification that can be matched with a single number of loops is unrolled to form an automaton having a plurality of the repeated sub-expressions linked serially. A quantification having a single number of loops corresponds to a quantification where n1 equals n2. The quantification "B{n1}", for example, can be unrolled as "BB . . . B", having n1 copies of B.

At block 308, a quantification that can be matched with a multiple number of loops is unrolled when n1 does not equal n2, and when n1 equals 1 and n2 is greater than 1. When n1 is greater than 1, the quantification is split into a first quantification that can be matched with n1−1 number of loops and a second quantification that can be matched with from one to n2−n1+1 numbers of loops. For example, the quantification B{n1, n2}, where n1>1, n2>1, and n1<n2 can be matched with multiple numbers of loops, in particular, from n1 to n2 numbers of loops. This quantification, B{n1, n2}, can be split into the following quantification B{n1−1}B{1, n2−n1+1}. The first quantification is the repeated sub-expression B that can be matched with a number of loops equal to n1−1. This first quantification is concatenated with a second quantification having the repeated sub-expression that can be matched by a number of loops from one to n2−n1+1. The first quantification B{n1−1} is unrolled as stated at 306.

The second quantification B{1, n2−n1+1} can be unrolled based on the in-degree and/or out-degree of the resulting automaton. Unrolling a quantification can create states that have a large in-degree or a large out-degree. In an example, in-degree corresponds to the number of transitions to a state of the automaton, and out-degree corresponds to the number of transitions from a state of the automaton. Accordingly, the second quantification can be unrolled to control the transitions into (the in-degree) or out of (the out-degree) states when converting the second quantification into an automaton. For example, the quantification can be unrolled to limit the in-degree of each unrolled state to below a threshold number. Limiting the in-degree can be performed, for example, to take into account aspects and/or limitations of elements in the target device. Moreover, limiting the in-degree during unrolling can reduce the subsequent processing for the compiler.

In an example, when unrolling the quantification B{1, n2−n1+1} the automaton is generated as a trade-off between in-degree and out-degree. Accordingly, reducing the in-degree may increase the out-degree and reducing the out-degree may increase the in-degree. In an example, to unroll the loop structure of the quantification B{1, n2−n1+1}, a number of transitions are made either to or from the unrolled states to make the automaton accept any string of k concatentated B, where 1<=k<=n2−n1+1. Controlling whether the transitions are made to or from the unrolled states can be used to control the in-degree/out-degree for the automaton.

Although method 300 is described as corresponding to a single quantification, method 300 can be repeated for a plurality of quantifications within a syntax tree, and the resulting separate automatons can then be linked into a larger automaton.

Figure 4A:
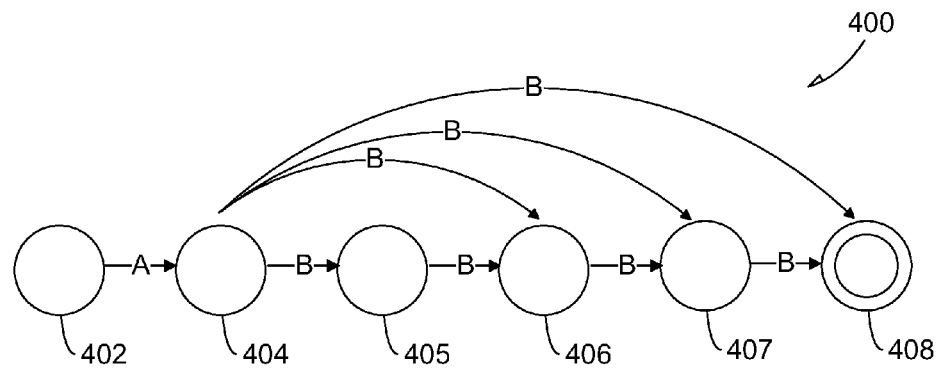
FIGS. 4A-4C illustrate example automatons for unrolled quantifications according to various embodiments of the invention.

FIG. 4A illustrates an example of an automaton 400 where the expression AB{1, 4} is unrolled to minimize the in-degree. An automaton resulting from a quantification unrolled to minimize the in-degree is also referred to herein as a scatter pattern. The scatter pattern unrolled version of the expression AB{1, 4} corresponds directly to the expression A((((B?)B)?B)?B), to which the automaton 400 corresponds. The automaton 400 includes a drive state 402 for the quantification B{1, 4} and a plurality of unrolled states 404-408, including a first state 404 of the quantification and a last state 408 of the quantification. In an example, each of the expressions A and B can correspond to multiple states for smaller automatons not shown. To minimize the in-degree of the automaton 400, the transitions for the quantification are assigned as out-transitions from the first state 404 to the other unrolled states 405-408. Accordingly, the first state 404 has a large out-degree (4 out-transitions), and all the quantification states 404-408 have a small in-degree (1 or 2 in-transitions).

Figure 4B:
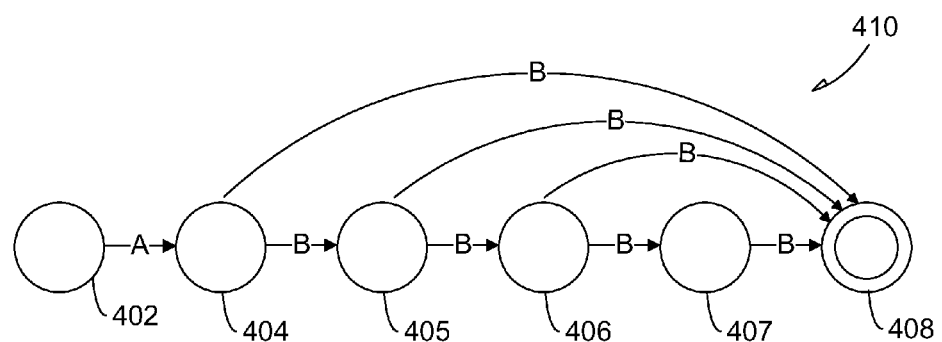

FIG. 4B illustrates an example of an automaton 410 where the expression AB{1, 4} is unrolled to minimize the out-degree. An automaton resulting from a quantification unrolled to minimize the out-degree is also referred to herein as a merge pattern. The merge pattern unrolled version of the expression AB{1, 4} corresponds directly to the unrolled expression AB(B(B(B)?)?)?. The automaton 408 includes the same states 402, 404-408 as the automaton 400 with different transitions between the states 402, 404-408. To minimize the out-degree of the automaton 410, the transitions for the quantification are assigned as in-transitions to the last state 408 of the quantification. The in-transitions come from each of the unrolled states 404-407. Accordingly, all of the quantification states 404-408 have a small out-degree (1 or 2 out-transitions), but the last state 408 of the quantification has a large in-degree (4 in-transitions).

In an example, an expression having a quantification is unrolled to limit one of the out-degree or the in-degree to less than a threshold. In an example, to unroll the expression AB{1, n1} to limit the in-degree to a threshold, a number of transitions for the quantification B{1, n1} up to the threshold can be assigned as in-transitions to the last state of the quantification B{1, n1}, and other transitions can be assigned as out-transitions for the first state of the quantification B{1, n1}. Conversely, to unroll an expression AB{1, n1} to limit the out-degree to a threshold, a number of transitions for the quantification B{1, n1} up to the threshold can be assigned as out-transitions to the first state for the quantification, and other transitions can be assigned as out-transitions for the last state of the quantification B{1, n1}.

Figure 4C:
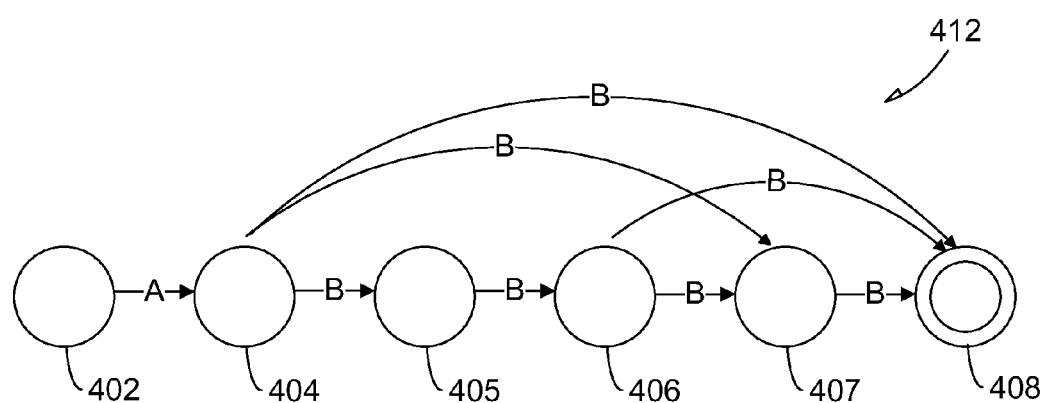

FIG. 4C illustrates another example of an automaton 412 where the expression AB{1, 4} is unrolled to limit the in-transitions for any state to less than or equal to 3. The automaton 412 includes the same states 402, 404-408 as the automatons 400 and 408 with different transitions between the states 402, 404-408. In an example, to limit the in-degree of the automaton 412 to less than or equal to three (3) in-transitions, the transitions for the quantification are initially assigned as in-transitions to the last state 408 of the quantification B{1, 4} until the limit of three has been reached, and other transitions are assigned as out-transitions from the quantification states 404-408. Thus, the last state 408 as well as the other quantification states 404-407 of the quantification have an in-degree of equal to or below the limit of 3 and the first state 404 has an out-degree of 3.

In other examples, the in-degree and out-degree of an expression can be set to be certain ratio (e.g., 1 to 1, 2 to 1) of each other. In yet other examples, the in-degree and out-degree of an expression can be set to be a certain ratio of each other up until a threshold is reached for either the in-transitions or out-transitions, and then another ratio can be used or all of the transitions can be assigned as in-transitions or out-transitions respectively.

EXAMPLE EMBODIMENTS

The description below with respect to FIGS. 5-15 pertains to example embodiments of implementing an automaton with limited in-degree and/or out-degree in a parallel machine. The description with reference to FIGS. 5-9 pertains to example parallel machines for implementing quantifications, and the description with reference to FIGS. 10-14 pertains to an example compiler to generate machine code to program the parallel machine to implement the quantification.

Figure 5:
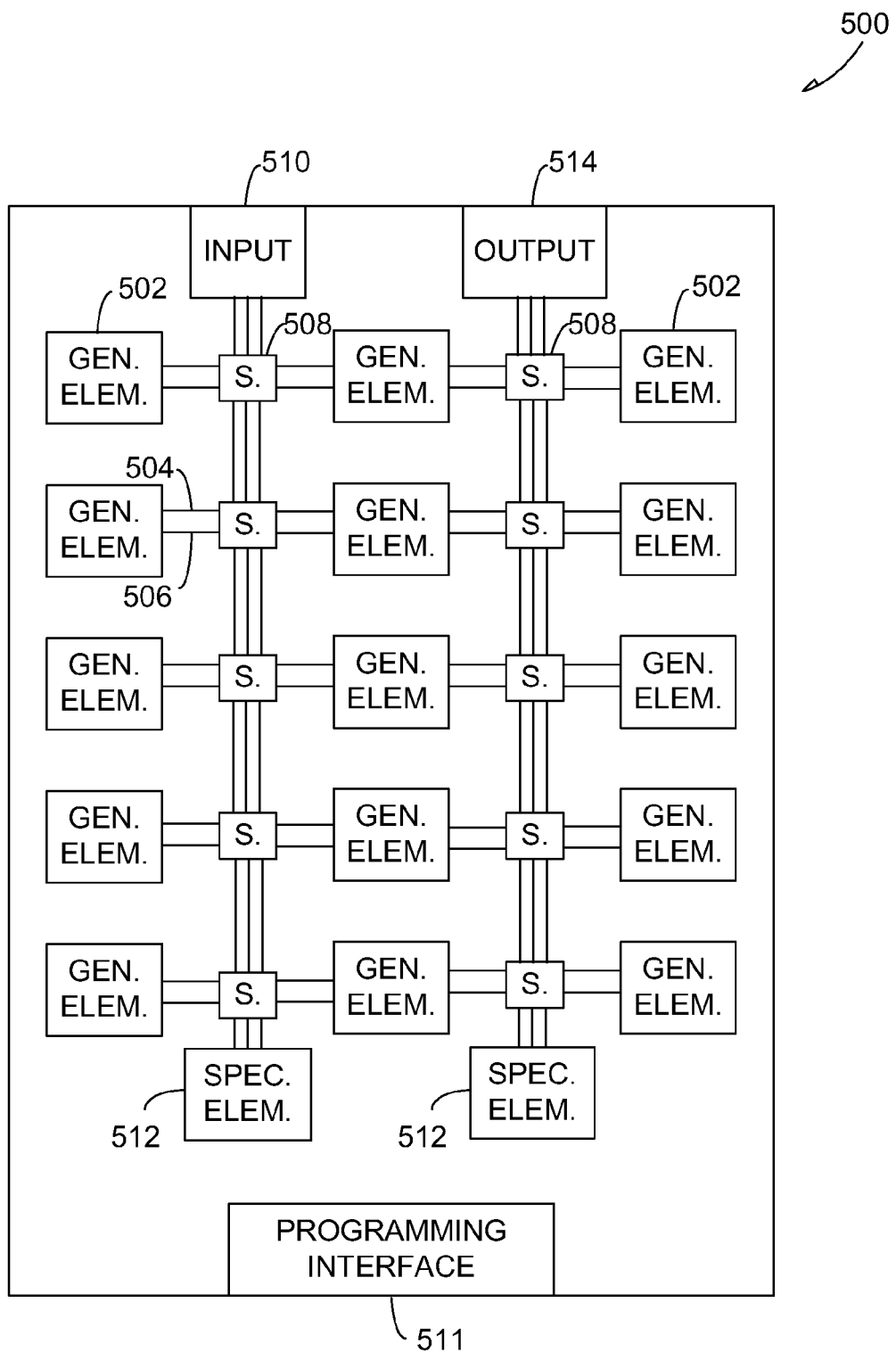
FIG. 5 illustrates an example of a parallel machine, according to various embodiments of the invention.

FIG. 5 illustrates an example parallel machine 500 that can be used to implement a hierarchical structure for analyzing data. The parallel machine 500 can receive input data and provide an output based on the input data. The parallel machine 500 can include a data input port 510 for receiving input data and an output port 514 for providing an output to another device. The data input port 510 provides an interface for data to be input to the parallel machine 500.

The parallel machine 500 includes a plurality of programmable elements including general purpose elements 502 and special purpose elements 512. A general purpose element 502 can include one or more inputs 504 and one or more outputs 506. A general purpose element 502 can be programmed into one of a plurality of states. The state of the general purpose element 502 determines what output(s) the general purpose elements 502 will provide based on a given input(s). That is, the state of the general purpose element 502 determines how the programmable element will react based on a given input. Data input to the data input port 510 can be provided to the plurality of general purpose elements 502 to cause the general purpose elements 502 to take action thereon. Examples of a general purpose element 502 can include a state machine element (SME) discussed in detail below, and a configurable logic block. In an example, a SME can be set in a given state to provide a certain output (e.g., a high or "1" signal) when a given input is received at the data input port 510. When an input other than the given input is received at the data input port 510, the SME can provide a different output (e.g., a low or "0" signal). In an example, a configurable logic block can be set to perform a Boolean logic function (e.g., AND, OR, NOR, ext.) based on input received at the data input port 510.

The parallel machine 500 can also include a programming interface 511 for loading a program (e.g., an image) onto the parallel machine 500. The image can program (e.g., set) the state of the general purpose elements 502. That is, the image can configure the general purpose elements 502 to react in a certain way to a given input. For example, a general purpose element 502 can be set to output a high signal when the character 'a' is received at the data input port 510. In some examples, the parallel machine 500 can use a clock signal for controlling the timing of operation of the general purpose elements 502. In certain examples, the parallel machine 500 can include special purpose elements 512 (e.g., RAM, logic gates, counters, look-up tables, etc.) for interacting with the general purpose elements 502, and for performing special purpose functions. In some embodiments, the data received at the data input port 510 can include a fixed set of data received over time or all at once, or a stream of data received over time. The data may be received from, or generated by, any source, such as databases, sensors, networks, etc, coupled to the parallel machine 500.

Figure 8:
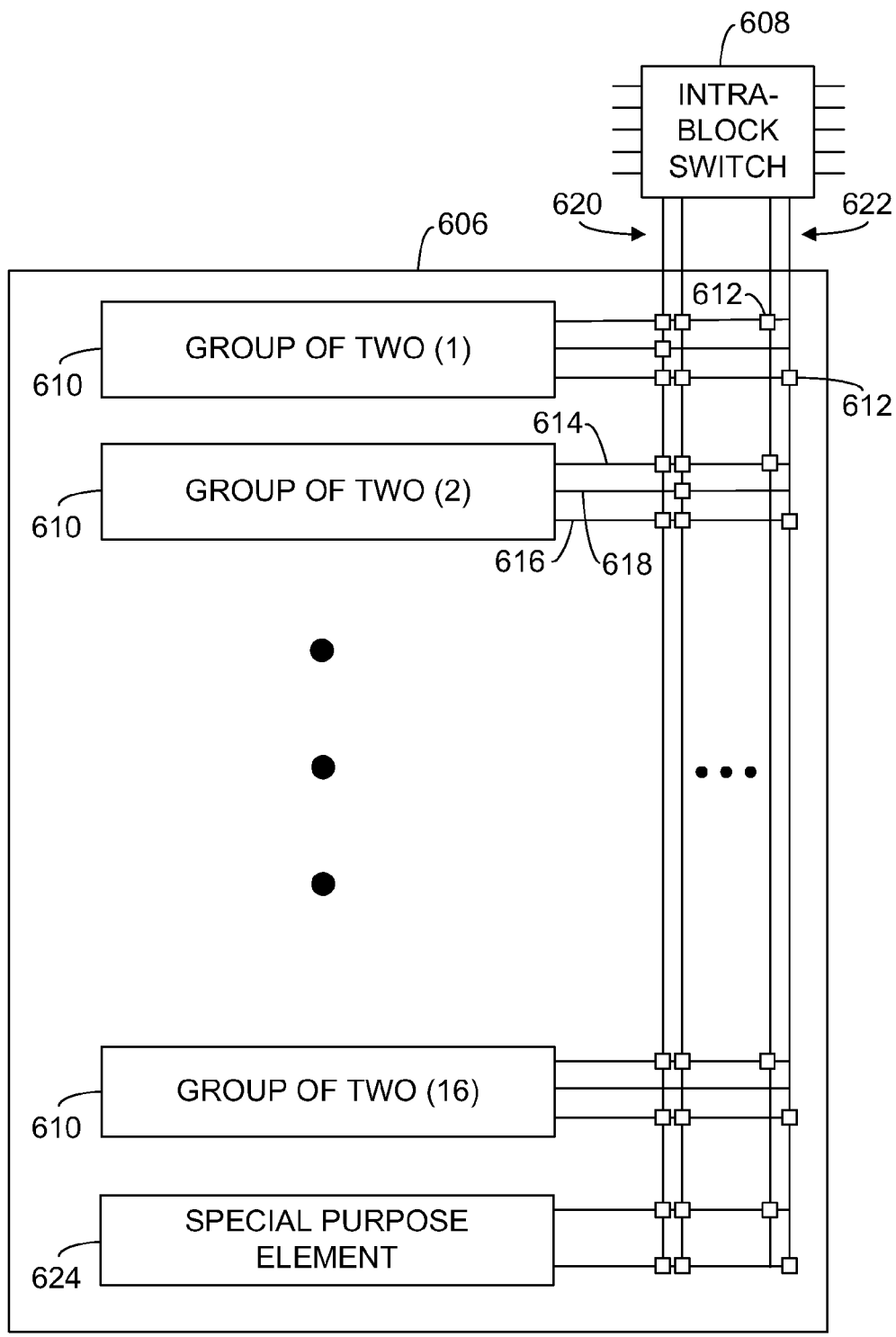
FIG. 8 illustrates an example of a row of the block of FIG. 7, according to various embodiments of the invention.

The parallel machine 500 also includes a plurality of programmable switches 508 for selectively coupling together different elements (e.g., general purpose element 502, data input port 510, output port 514, programming interface 511, and special purpose elements 512) of the parallel machine 500. Accordingly, the parallel machine 500 comprises a programmable matrix formed among the elements. In an example, a programmable switch 508 can selectively couple two or more elements to one another such that an input 504 of a general purpose element 502, the data input port 510, a programming interface 511, or special purpose element 512 can be coupled through one or more programmable switches 508 to an output 506 of a general purpose element 502, the output port 514, a programming interface 511, or special purpose element 512. Thus, the routing of signals between the elements can be controlled by setting the programmable switches 508. Although FIG. 5 illustrates a certain number of conductors (e.g., wires) between a given element and a programmable switch 508, it should be understood that in other examples, a different number of conductors can be used. Also, although FIG. 5 illustrates each general purpose element 502 individually coupled to a programmable switch 508, in other examples, multiple general purpose elements 502 can be coupled as a group (e.g., a block 802, as illustrated in FIG. 8) to a programmable switch 508. In an example, the data input port 510, the data output port 514, and/or the programming interface 511 can be implemented as registers such that writing to the registers provides data to or from the respective elements.

In an example, a single parallel machine 500 is implemented on a physical device, however, in other examples two or more parallel machines 500 can be implemented on a single physical device (e.g., physical chip). In an example, each of multiple parallel machines 500 can include a distinct data input port 510, a distinct output port 514, a distinct programming interface 511, and a distinct set of general purpose elements 502. Moreover, each set of general purpose elements 502 can react (e.g., output a high or low signal) to data at their corresponding input data port 510. For example, a first set of general purpose elements 502 corresponding to a first parallel machine 500 can react to the data at a first data input port 510 corresponding to the first parallel machine 500. A second set of general purpose elements 502 corresponding to a second parallel machine 500 can react to a second data input port 510 corresponding to the second parallel machine 500. Accordingly, each parallel machine 500 includes a set of general purpose elements 502, wherein different sets of general purpose elements 502 can react to different input data. Similarly, each parallel machine 500, and each corresponding set of general purpose elements 502 can provide a distinct output. In some examples, an output port 514 from first parallel machine 500 can be coupled to an input port 510 of a second parallel machine 500, such that input data for the second parallel machine 500 can include the output data from the first parallel machine 500.

In an example, an image for loading onto the parallel machine 500 comprises a plurality of bits of information for setting the state of the general purpose elements 502, programming the programmable switches 508, and configuring the special purpose elements 512 within the parallel machine 500. In an example, the image can be loaded onto the parallel machine 500 to program the parallel machine 500 to provide a desired output based on certain inputs. The output port 514 can provide outputs from the parallel machine 500 based on the reaction of the general purpose elements 502 to data at the data input port 510. An output from the output port 514 can include a single bit indicating a match of a given pattern, a word comprising a plurality of bits indicating matches and non-matches to a plurality of patterns, and a state vector corresponding to the state of all or certain general purpose elements 502 at a given moment.

Example uses for the parallel machine 500 include, pattern-recognition (e.g., speech recognition, image recognition, etc.) signal processing, imaging, computer vision, cryptography, and others. In certain examples, the parallel machine 500 can comprise a finite state machine (FSM) engine, a field programmable gate array (FPGA), and variations thereof. Moreover, the parallel machine 500 may be a component in a larger device such as a computer, pager, cellular phone, personal organizer, portable audio player, network device (e.g., router, firewall, switch, or any combination thereof), control circuit, camera, etc.

FIGS. 6-9 illustrate an example of a parallel machine referred to herein as "FSM engine 600". In an example, the FSM engine 600 comprises a hardware implementation of a finite state machine. Accordingly, the FSM engine 600 implements a plurality of selectively coupleable hardware elements (e.g., programmable elements) that correspond to a plurality of states in a FSM. Similar to a state in a FSM, a hardware element can analyze an input stream and activate a downstream hardware element based on the input stream.

The FSM engine 600 includes a plurality of programmable elements including general purpose elements and special purpose elements. The general purpose elements can be programmed to implement many different functions. These general purpose elements include SMEs 604, 605 (shown in FIG. 9) that are hierarchically organized into rows 606 (shown in FIGS. 7 and 8) and blocks 602 (shown in FIGS. 6 and 7). To route signals between the hierarchically organized SMEs 604, 605, a hierarchy of programmable switches is used including inter-block switches 603 (shown in FIGS. 6 and 7), intra-block switches 608 (shown in FIGS. 7 and 8) and intra-row switches 612 (shown in FIG. 8). A SME 604, 605 can correspond to a state of a FSM implemented by the FSM engine 600. The SMEs 604, 605 can be coupled together by using the programmable switches as described below. Accordingly, a FSM can be implemented on the FSM engine 600 by programming the SMEs 604, 605 to correspond to the functions of states and by selectively coupling together the SMEs 604, 605 to correspond to the transitions between states in the FSM.

Figure 6:
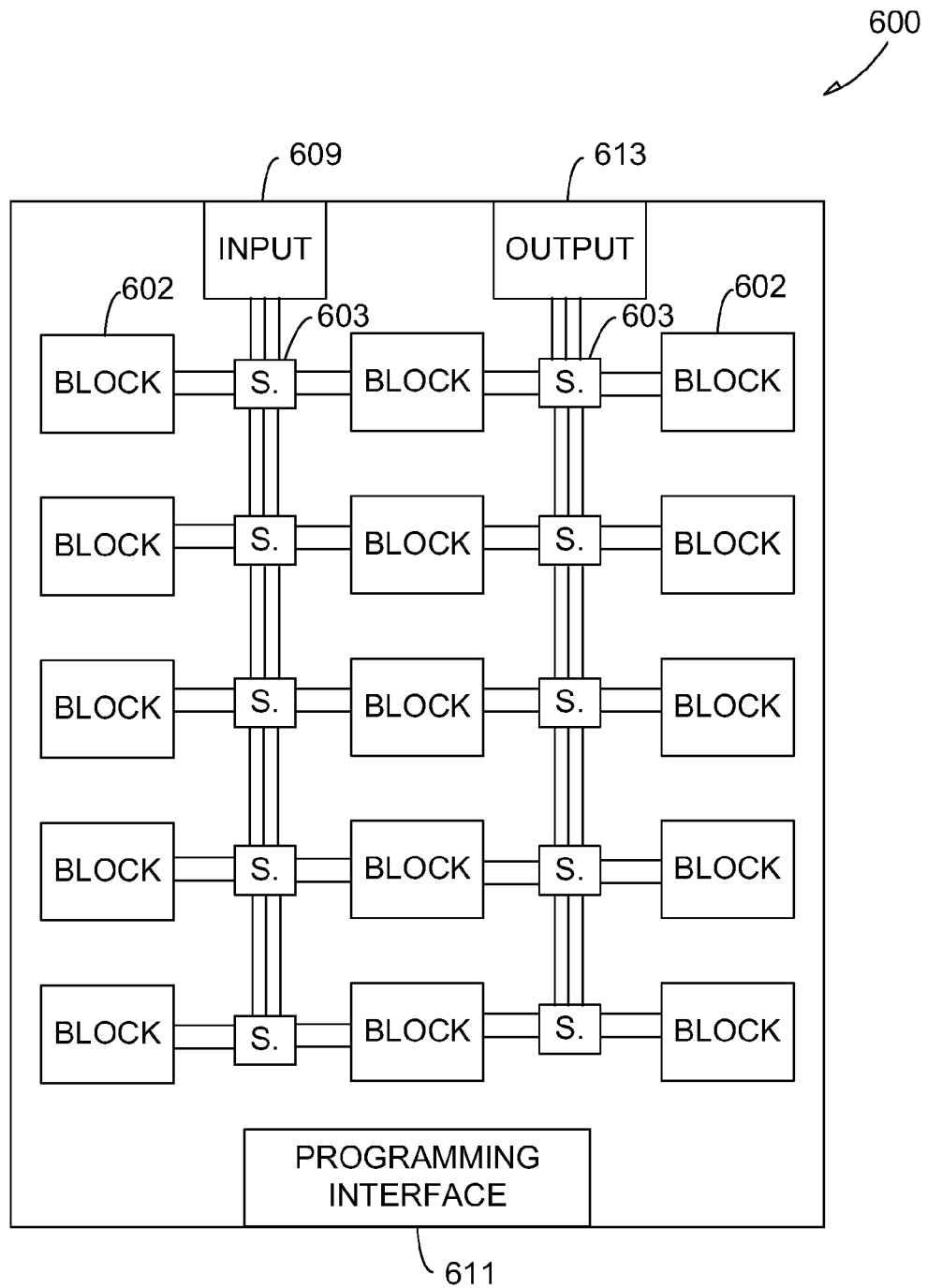
FIG. 6 illustrates an example of the parallel machine of FIG. 5 implemented as a finite state machine engine, according to various embodiments of the invention.

FIG. 6 illustrates an overall view of an example FSM engine 600. The FSM engine 600 includes a plurality of blocks 602 that can be selectively coupled together with programmable inter-block switches 603. Additionally, the blocks 602 can be selectively coupled to an input block 609 (e.g., a data input port) for receiving signals (e.g., data) and providing the data to the blocks 602. The blocks 602 can also be selectively coupled to an output block 613 (e.g., an output port) for providing signals from the blocks 602 to an external device (e.g., another FSM engine 600). The FSM engine 600 can also include a programming interface 611 to load a program (e.g., an image) onto the FSM engine 600. The image can program (e.g., set) the state of the SMEs 604, 605. That is, the image can configure the SMEs 604, 605 to react in a certain way to a given input at the input block 609. For example, a SME 604 can be set to output a high signal when the character 'a' is received at the input block 609.

In an example, the input block 609, the output block 613, and/or the programming interface 611 can be implemented as registers such that writing to the registers provides data to or from the respective elements. Accordingly, bits from the image stored in the registers corresponding to the programming interface 611 can be loaded on the SMEs 604, 605. Although FIG. 6 illustrates a certain number of conductors (e.g., wire, trace) between a block 602, input block 609, output block 613, and an inter-block switch 603, it should be understood that in other examples, fewer or more conductors can be used.

Figure 7:
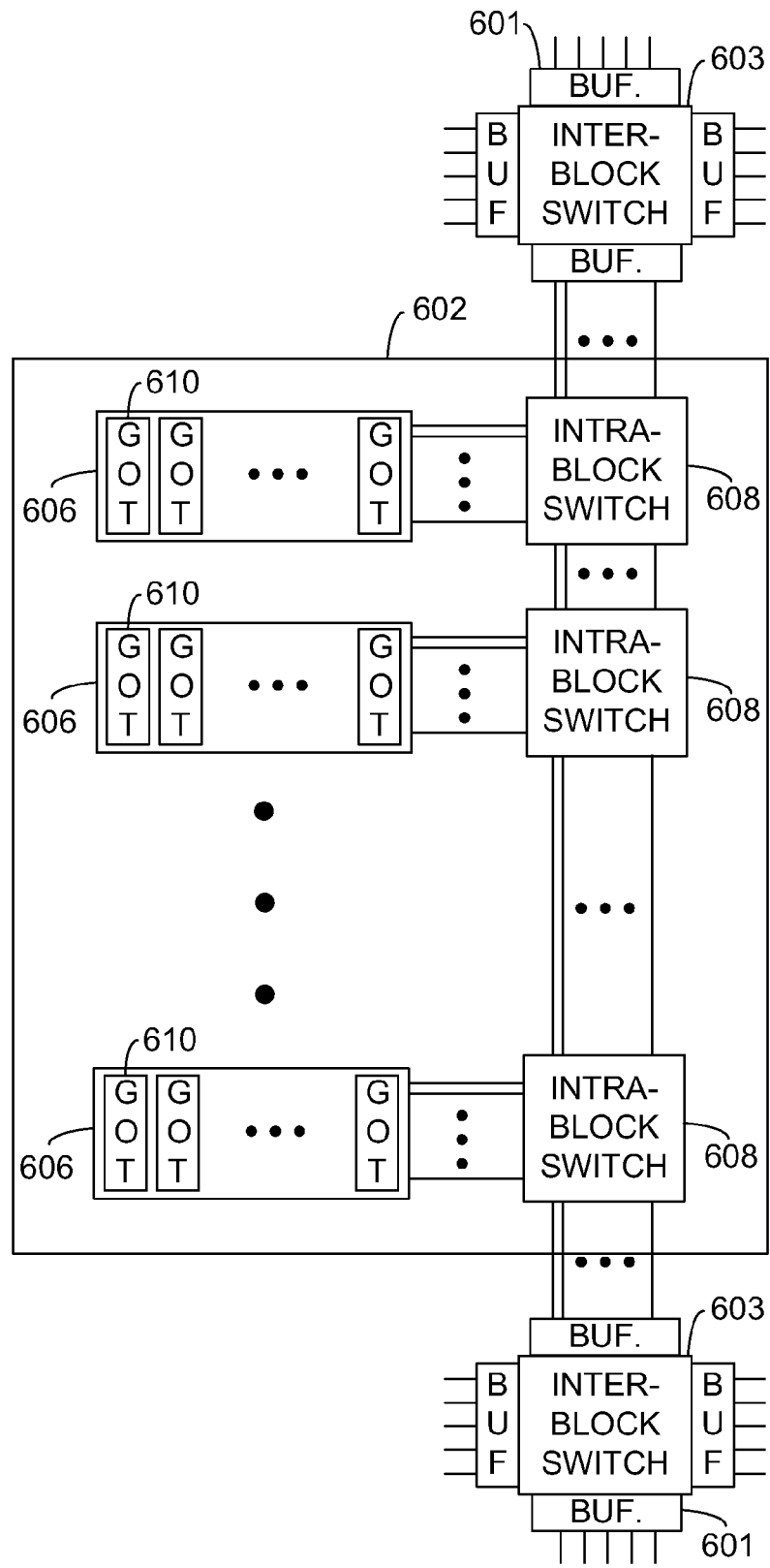
FIG. 7 illustrates an example of a block of the finite state machine engine of FIG. 6, according to various embodiments of the invention.

FIG. 7 illustrates an example of a block 602. A block 602 can include a plurality of rows 606 that can be selectively coupled together with programmable intra-block switches 608. Additionally, a row 606 can be selectively coupled to another row 606 within another block 602 with the inter-block switches 603. In an example, buffers 601 are included to control the timing of signals to/from the inter-block switches 603. A row 606 includes a plurality of SMEs 604, 605 organized into pairs of elements that are referred to herein as groups of two (GOTs) 610. In an example, a block 602 comprises sixteen (16) rows 606.

FIG. 8 illustrates an example of a row 606. A GOT 610 can be selectively coupled to other GOTs 610 and any other elements 624 within the row 606 by programmable intra-row switches 612. A GOT 610 can also be coupled to other GOTs 610 in other rows 606 with the intra-block switch 608, or other GOTs 610 in other blocks 602 with an inter-block switch 603. In an example, a GOT 610 has a first and second input 614, 616, and an output 618. The first input 614 is coupled to a first SME 604 of the GOT 610 and the second input 614 is coupled to a second SME 604 of the GOT 610.

In an example, the row 606 includes a first and second plurality of row interconnection conductors 620, 622. In an example, an input 614, 616 of a GOT 610 can be coupled to one or more row interconnection conductors 620, 622, and an output 618 can be coupled to one row interconnection conductor 620, 622. In an example, a first plurality of the row interconnection conductors 620 can be coupled to each SME 604 of each GOT 610 within the row 606. A second plurality of the row interconnection conductors 622 can be coupled to one SME 604 of each GOT 610 within the row 606, but cannot be coupled to the other SME 604 of the GOT 610. In an example, a first half of the second plurality of row interconnection conductors 622 can couple to first half of the SMEs 604 within a row 606 (one SME 604 from each GOT 610) and a second half of the second plurality of row interconnection conductors 622 can couple to a second half of the SMEs 604 within a row 606 (the other SME 604 from each GOT 610). The limited connectivity between the second plurality of row interconnection conductors 622 and the SMEs 604, 605 is referred to herein as "parity".

In an example, the row 606 can also include a special purpose element 624 such as a counter, a programmable Boolean logic element, a field programmable gate array (FPGA), an application specific integrated circuit (ASIC), a programmable processor (e.g., a microprocessor), and other elements. Additionally, in an example, the special purpose element 624 is different in different rows 606. For example four of the rows 606 in a block 602 can include Boolean logic as the special purpose element 624, and the other eight rows 606 in a block 602 can include a counter as the special purpose element 624.

In an example, the special purpose element 624 includes a counter (also referred to herein as counter 624). In an example, the counter 624 comprises a 12-bit programmable down counter. The 12-bit programmable counter 624 has a counting input, a reset input, and zero-count output. The counting input, when asserted, decrements the value of the counter 624 by one. The reset input, when asserted, causes the counter 624 to load an initial value from an associated register. For the 12-bit counter 624, up to a 12-bit number can be loaded in as the initial value. When the value of the counter 624 is decremented to zero (0), the zero-count output is asserted. The counter 624 also has at least two modes, pulse and hold. When the counter 624 is set to pulse mode, the zero-count output is asserted during the first clock cycle when the counter 624 decrements to zero, and at the following clock cycles the zero-count output is no longer asserted even if the counting input is asserted. This state continues until the counter 624 is reset by the reset input being asserted. When the counter 624 is set to hold mode the zero-count output is asserted during the first clock cycle when the counter 624 decrements to zero, and stays asserted when the counting input is asserted until the counter 624 is reset by the reset input being asserted.

Figure 9:
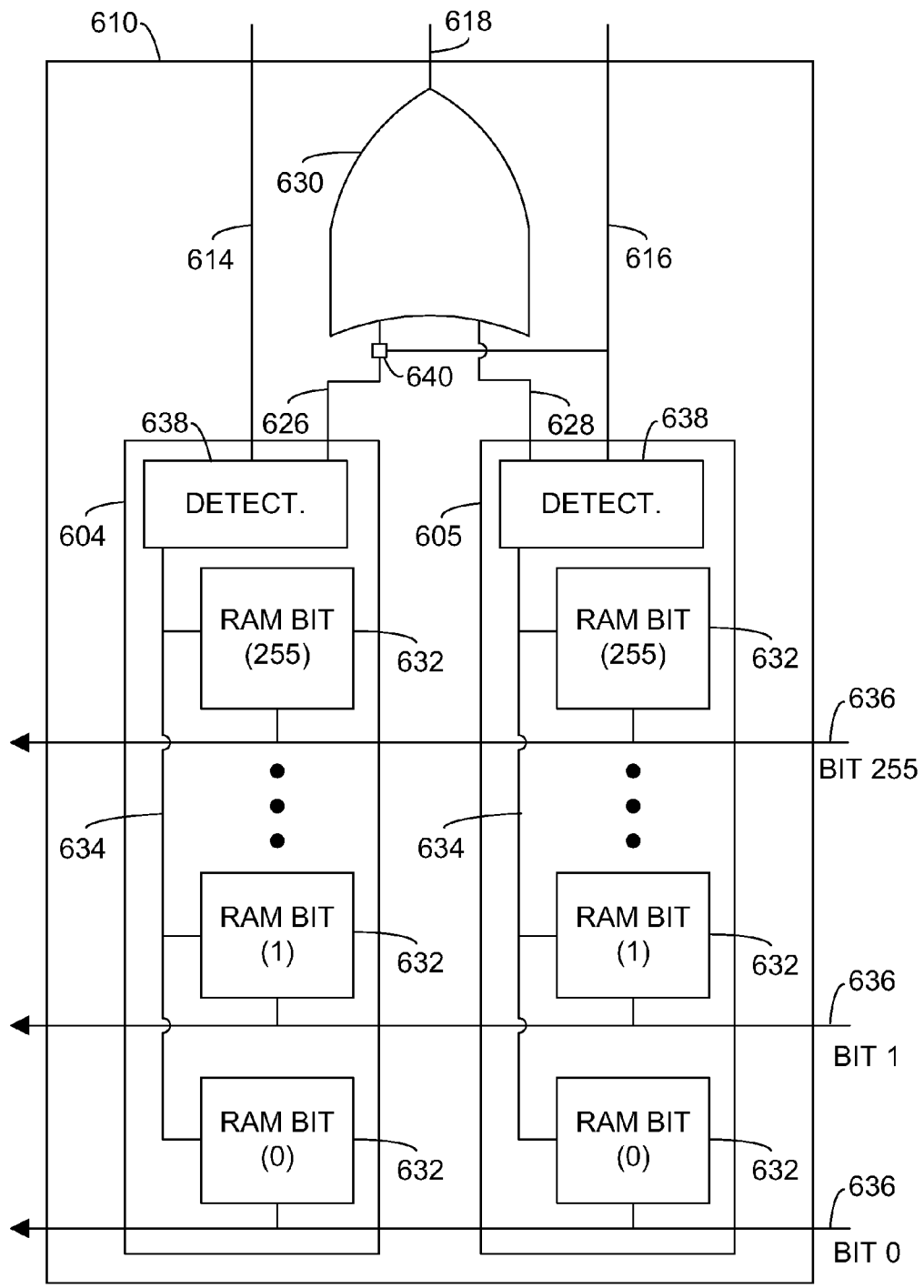
FIG. 9 illustrates an example of a group of two of the row of FIG. 8, according to various embodiments of the invention.

FIG. 9 illustrates an example of a GOT 610. The GOT 610 includes a first and a second SME 604, 605 having inputs 614, 616 and having their outputs 626, 628 coupled to an OR gate 630. The outputs 626, 628 are logical OR'd together with the OR gate 630 to form the common output 618 of the GOT 610. In an example, the first and second SME 604, 605 exhibit parity where the input 614 of the first SME 604 can be coupled to some of the row interconnection conductors 622 and the input 616 of the second SME 605 can be coupled to other row interconnection conductors 622. In an example, the two SMEs 604, 605 within a GOT 610 can be cascaded by setting the switch 640 to couple the output 626 of the first SME 604 to the input 616 of the second SME 605.

In an example, a state machine element 604, 605 comprises a plurality of memory cells 632, such as those often used in dynamic random access memory (DRAM), coupled in parallel to a detect line 634. One such memory cell 632 comprises a memory cell that can be set to a data state, such as one that corresponds to either a high or a low value (e.g., a 1 or 0). The output of the memory cell 632 is coupled to the detect line 634 and the input to the memory cell 632 receives signals based on data on the data stream line 636. In an example, an input on the data stream line 636 is decoded to select one of the memory cells 632. The selected memory cell 632 provides its stored data state as an output onto the detect line 634. For example, the data received at the data input port 609 can be provided to a decoder (not shown) and the decoder can select one of the data stream lines 636. In an example, the decoder can convert an ACSII character to 1 of 256 bits.

A memory cell 632, therefore, outputs a high signal to the detect line 634 when the memory cell 632 is set to a high value and the data on the data stream line 636 corresponds to the memory cell 632. When the data on the data stream line 636 corresponds to the memory cell 632 and the memory cell 632 is set to a low value, the memory cell 632 outputs a low signal to the detect line 634. The outputs from the memory cells 632 on the detect line 634 are sensed by a detect circuit 638. In an example, the signal on an input line 614, 616 sets the respective detect circuit 638 to either an active or inactive state. When set to the inactive state, the detect circuit 638 outputs a low signal on the respective output 626, 628 regardless of the signal on the respective detect line 634. When set to an active state, the detect circuit 638 outputs a high signal on the respective output line 626, 628 when a high signal is detected from one of the memory cells 634 of the respective SME 604, 605. When in the active state, the detect circuit 638 outputs a low signal on the respective output line 626, 628 when the signals from all of the memory cells 634 of the respective SME 604, 605 are low.

In an example, an SME 604, 605 includes 256 memory cells 632 and each memory cell 632 is coupled to a different data stream line 636. Thus, an SME 604, 605 can be programmed to output a high signal when a selected one or more of the data stream lines 636 have a high signal thereon. For example, the SME 604 can have a first memory cell 632 (e.g., bit 0) set high and all other memory cells 632 (e.g., bits 1-255) set low. When the respective detect circuit 638 is in the active state, the SME 604 outputs a high signal on the output 626 when the data stream line 636 corresponding to bit 0 has a high signal thereon. In other examples, the SME 604 can be set to output a high signal when one of multiple data stream lines 636 have a high signal thereon by setting the appropriate memory cells 632 to a high value.

In an example, a memory cell 632 can be set to a high or low value by reading bits from an associated register. Accordingly, the SMEs 604 can be programmed by storing an image created by the compiler into the registers and loading the bits in the registers into associated memory cells 632. In an example, the image created by the compiler includes a binary image of high and low (e.g., 1 and 0) bits. The image can program the FSM engine 600 to operate as a FSM by cascading the SMEs 604, 605. For example, a first SME 604 can be set to an active state by setting the detect circuit 638 to the active state. The first SME 604 can be set to output a high signal when the data stream line 636 corresponding to bit 0 has a high signal thereon. The second SME 605 can be initially set to an inactive state, but can be set to, when active, output a high signal when the data stream line 636 corresponding to bit 1 has a high signal thereon. The first SME 604 and the second SME 605 can be cascaded by setting the output 626 of the first SME 604 to couple to the input 616 of the second SME 605. Thus, when a high signal is sensed on the data stream line 636 corresponding to bit 0, the first SME 604 outputs a high signal on the output 626 and sets the detect circuit 638 of the second SME 605 to an active state. When a high signal is sensed on the data stream line 636 corresponding to bit 1, the second SME 605 outputs a high signal on the output 628 to activate another SME 605 or for output from the FSM engine 600.

Figure 10:
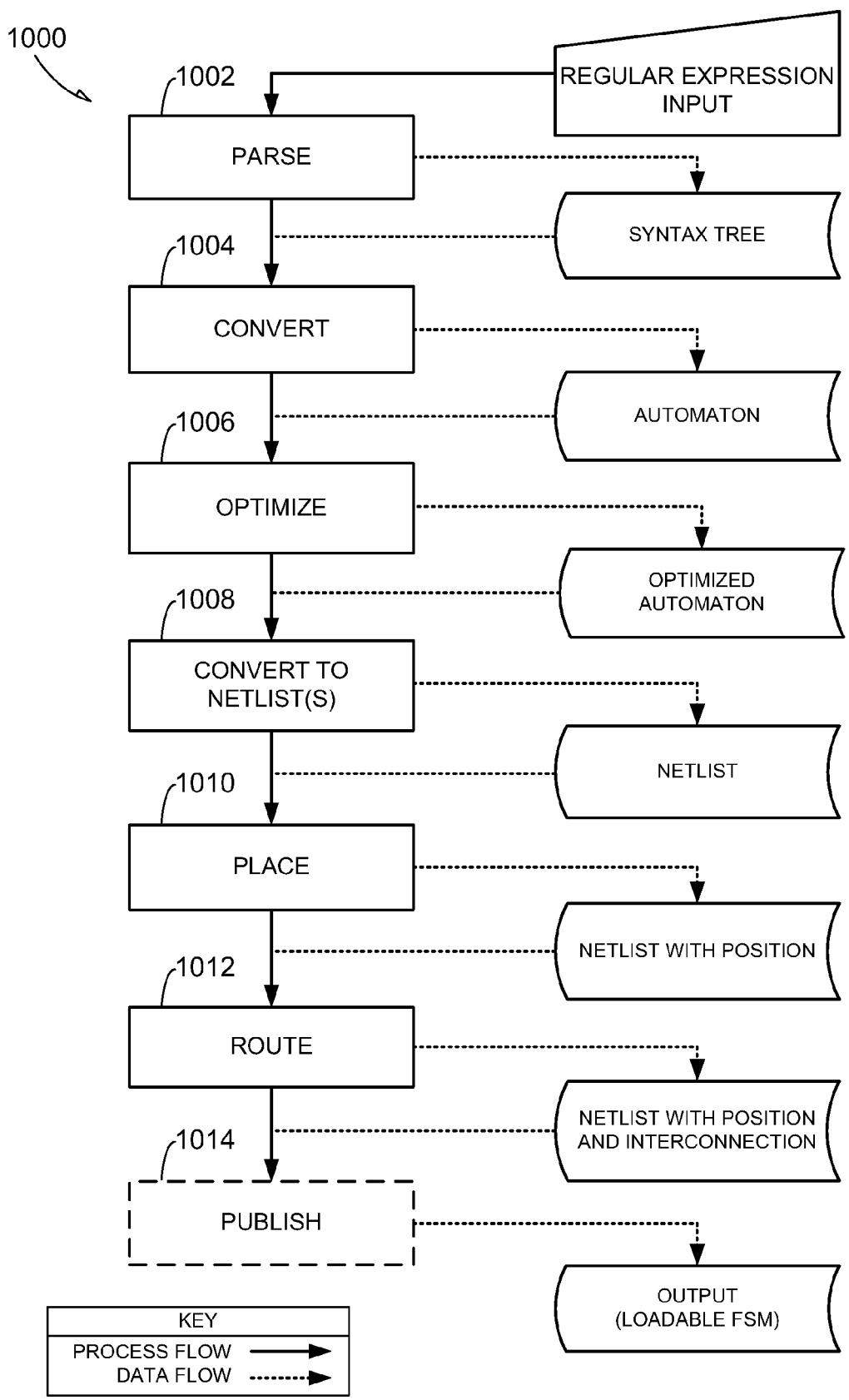
FIG. 10 illustrates an example of a method for a compiler to convert regular expressions into an image configured to program the parallel machine of FIG. 5, according to various embodiments of the invention.

FIG. 10 illustrates an example of a method 1000 for a compiler to convert source code into an image configured to program a parallel machine. Method 1000 includes parsing the source code into a syntax tree (block 1002), converting the syntax tree into an automaton (block 1004), optimizing the automaton (block 1006), converting the automaton into a netlist (block 1008), placing the netlist on hardware (block 1010), routing the netlist (block 1012), and publishing the resulting image (block 1014).

In an example, the compiler includes an application programming interface (API) that allows software developers to create images for implementing FSMs on the FSM engine 600. The compiler provides methods to convert an input set of regular expressions into an image that is configured to program the FSM engine 600. The compiler can be implemented by instructions for a computer having a Von Nuemann architecture. These instructions can cause a processor on the computer to implement the functions of the compiler. For example, the instructions, when executed by the processor, can cause the processor to perform actions as described in blocks 1002, 1004, 1006, 1008, 1010, 1012, and 1014 on source code that is accessible to the processor. An example computer having a Von Nuemann architecture is shown in FIG. 15 and described below.

At block 1002, source code is parsed to form a syntax tree. Parsing creates a generic representation of the source code as explained above with respect to FIG. 3. In addition, parsing can take into account regexs that are, and are not, supported by the FSM engine 600. Regexs that are supported can be converted into the appropriate machine code implementations; however, regexs that are not supported can, for example, generate an error, or be converted into supported machine code that is close in functionality to the non-supported regex.

At block 1004, the syntax tree is converted into an automaton. As mentioned above with respect to FIG. 3, converting the syntax tree converts the syntax tree into an automaton comprising a plurality of states. In an example, the automaton can be converted based partly on the hardware of the FSM engine 600.

In an example, input symbols for the automaton include the symbols of the alphabet, the numerals 0-9, and other printable characters. In an example, the input symbols are represented by the byte values 0 through 255 inclusive. In an example, an automaton can be represented as a directed graph where the nodes of the graph correspond to the set of states. In an example, a transition from state p to state q on an input symbol $\alpha$, i.e. $\delta(p, \alpha)$, is shown by a directed connection from node p to node q.

In an example, the automaton comprises general purpose states as well as special purpose states. The general purpose states and special purpose states correspond to general purpose elements and special purpose elements supported by a target device for which the compiler is generating machine code. Different types of target devices can support different types of general purpose elements as well as one or more different types of special purpose elements. A general purpose element can typically be used to implement a broad range of functions, while a special purpose element can typically be used to implement a more narrow range of functions. In an example, however, a special purpose element can achieve, for example, greater efficiency within its narrow range of function. Accordingly, a special purpose element can be used to, for example, reduce the machine cycles or the machine resources required to implement certain functions in the target device. In some examples, the target device supports solely special purpose elements, wherein multiple different types of special purpose elements are supported.

In an example where the compiler is generating machine code for the FSM engine 600, the general purpose states can correspond to SMEs 604, 605 and the general purpose states are accordingly referred to herein as "SME states". Moreover, when the compiler is generating machine code for the FSM engine 600, the special purpose states can correspond to counters 624 and are accordingly referred to herein as "counter states". In an example, the SME states in the automaton map 1:1 to SMEs (e.g., SME 604, 605) in the FSM engine 600 with the exception of the starting state of the automaton which does not map to a SME. The counters 624 may, or may not, map 1:1 to counter states.

In an example, special transition symbols outside the input symbol range may be used in the automaton. These special transition symbols can be used, for example, to enable use of special purpose elements 224. Moreover, special transition symbols can be used to provide transitions that occur on something other than an input symbol. For example, a special transition symbol may indicate that a first state is to be enabled (e.g., transitioned to) when both a second state and a third state are enabled. Accordingly, the first state is activated when both the second state and the third state are activated, and the transition to the first state is not directly dependent on an input symbol. Notably, a special transition symbol that indicates that a first state is to be enabled when both a second state and a third state are enabled can be used to represent a Boolean AND function performed, for example, by Boolean logic as the special purpose element 224. In an example, a special transition symbol can be used to indicate a counter state has reached zero, and thus transitions to a downstream state.

In an example, an automaton can be constructed using one of the standard techniques such as Glushkov's method. In an example, the automaton can be an ϵ-free homogeneous automaton. Additional detail regarding converting the syntax tree into an automaton is provided with respect to FIGS. 3, 4A-4C, 11A, 11B, 12, 13, and 14 below.

At block 1006, once the syntax tree has been converted to an automaton, the automaton is optimized. The automaton can be optimized to, among other things reduce its complexity and size. The automaton can be optimized by combining redundant states.

At block 1008, the optimized automaton is converted into a netlist. Converting the automaton into a netlist maps each state of the automaton to an instance of a hardware element (e.g., SMEs 604, 605, special purpose elements 624) on the FSM engine 600. Also, the connections between the instances are determined to create the netlist.

At block 1010, the netlist is placed to select a specific hardware element of the target device (e.g., SMEs 604, 605, special purpose elements 624) corresponding to each instance of the netlist. In an example, placing selects each specific hardware element based on general input and output constraints for of the FSM engine 600.

At block 1012, the placed netlist is routed to determine the settings for the programmable switches (e.g., inter-block switches 603, intra-block switches 608, and intra-row switches 612) in order to couple the selected hardware elements together to achieve the connections describe by the netlist. In an example, the settings for the programmable switches are determined by determining specific conductors of the FSM engine 600 that will be used to connect the selected hardware elements, and the settings for the programmable switches. Routing can take into account more specific limitations of the connections between the hardware elements that placement at block 1010. Accordingly, routing may adjust the location of some of the hardware elements as determined by the global placement in order to make appropriate connections given the actual limitations of the conductors on the FSM engine 600.

Once the netlist is placed and routed, the placed and routed netlist can be converted into a plurality of bits for programming of a FSM engine 200. The plurality of bits are referred to herein as an image.

At block 1014, an image is published by the compiler. The image comprises a plurality of bits for programming specific hardware elements and/or programmable switches of the FSM engine 600. In embodiments where the image comprises a plurality of bits (e.g., 0 and 1), the image can be referred to as a binary image. The bits can be loaded onto the FSM engine 600 to program the state of SMEs 604, 605, the special purpose elements 624, and the programmable switches such that the programmed FSM engine 600 implements a FSM having the functionality described by the source code. Placement (block 1010) and routing (block 1012) can map specific hardware elements at specific locations in the FSM engine 600 to specific states in the automaton. Accordingly, the bits in the image can program the specific hardware elements and/or programmable switches to implement the desired function(s). In an example, the image can be published by saving the machine code to a computer readable medium. In another example, the image can be published by displaying the image on a display device. In still another example, the image can be published by sending the image to another device, such as a programming device for loading the image onto the FSM engine 600. In yet another example, the image can be published by loading the image onto a parallel machine (e.g., the FSM engine 600).

In an example, an image can be loaded onto the FSM engine 600 by either directly loading the bit values from the image to the SMEs 604, 605 and other hardware elements 624 or by loading the image into one or more registers and then writing the bit values from the registers to the SMEs 604, 605 and other hardware elements 624. In an example, the hardware elements (e.g., SMEs 604, 605, other elements 624, programmable switches 603, 608, 612) of the FSM engine 600 are memory mapped such that a programming device and/or computer can load the image onto the FSM engine 600 by writing the image to one or more memory addresses.

Referring back to FIGS. 3 and 4A-4C, when converting the syntax tree into an automaton, the in-degree and/or out-degree of an unrolled quantification can be controlled. In an example, the in-degree and/or out-degree are controlled based on a threshold. The threshold can be, for example, based on a hardware limitation of the parallel machine 500 for which the compiler is preparing an image. For example, if a general purpose element 502 of the parallel machine 500 can have a maximum of 14 in-transitions, the threshold for unrolling can be set to less than or equal to 14 in-transitions. In other examples, the threshold for unrolling can be set such that a portion of the maximum in-transitions are used. For example, for a general purpose element 502 having a maximum of 14 in-transitions, the threshold can be set to 7 in-transitions to account for in-transitions from expressions not in the expression being unrolled.

Unrolling can be formulated as a general graph problem described as following. FIGS. 11A, 11B, 12, and 13 illustrate graphs of four solutions to Problem 1 discussed below, where the in-degree and out-degree are controlled. Different solutions provide different maximum length, which is determined by the in-degree and out-degree threshold. Accordingly, depending on the desired in-degree and out-degree a given solution may be chosen. The resultant in-degree and/or out-degree of the automaton is a function of which solution is chosen to the two problems discussed below.

Problem 1 (Extend path with in-degree and out-degree constraints). Given a directed path of length n and two unsigned integers p>1 and q>1. Denote the n+1 vertices as v0->v1->v2->...->vn. The starting vertex of the path is v0 and the ending vertex is vn. Add edges to this path so that there is no loop introduced, and for any k, 1<=k<=n, there exists a directed path from v0 to vn with length k; also, the in-degree of all vertices must be no greater than p, and the out-degree of all vertices must be no greater than q.

Problem 2 (Maximize path with in-degree and out-degree constraints). Given an infinite directed path and two unsigned integers p>1 and q>1. Denote the vertices as v0->v1->v2->.... Add edges to this path and find an ending vertex, denoted as vm, so that for any k, 1<=k<=m, there exists a directed path from v0 to vm with length k; the in-degree of all vertices must be no greater than p, and the out-degree of all vertices must be no greater than q. No loop is allowed in the graph. The optimization goal is to maximize the length of the resulted path, m.

Figure 12:
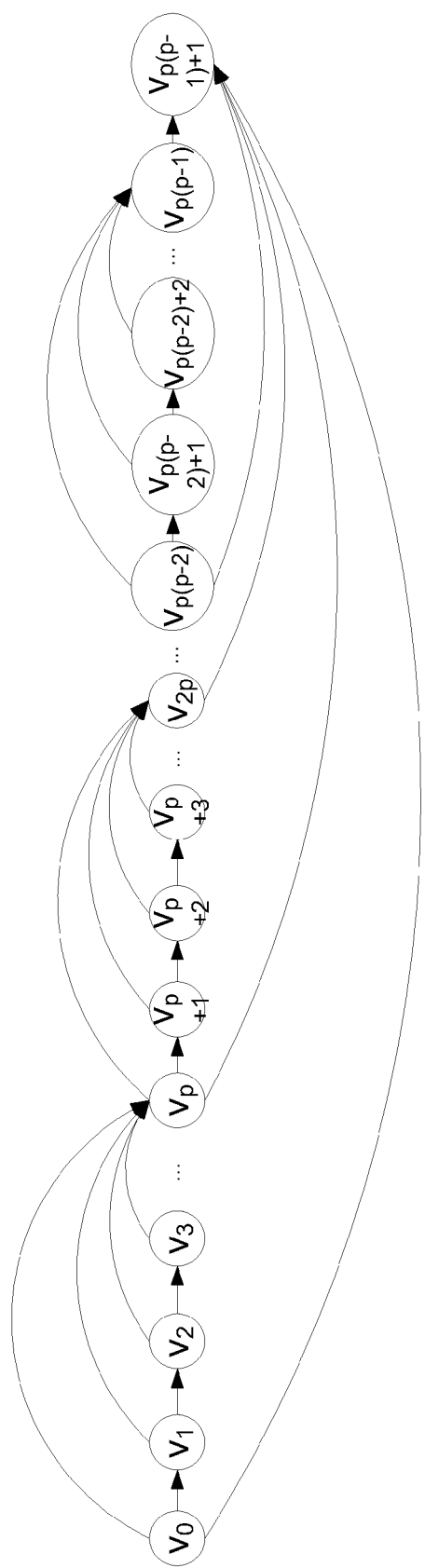
FIG. 12 illustrates another example graph corresponding to automatons for quantification according to various embodiments of the invention.
Figure 13:
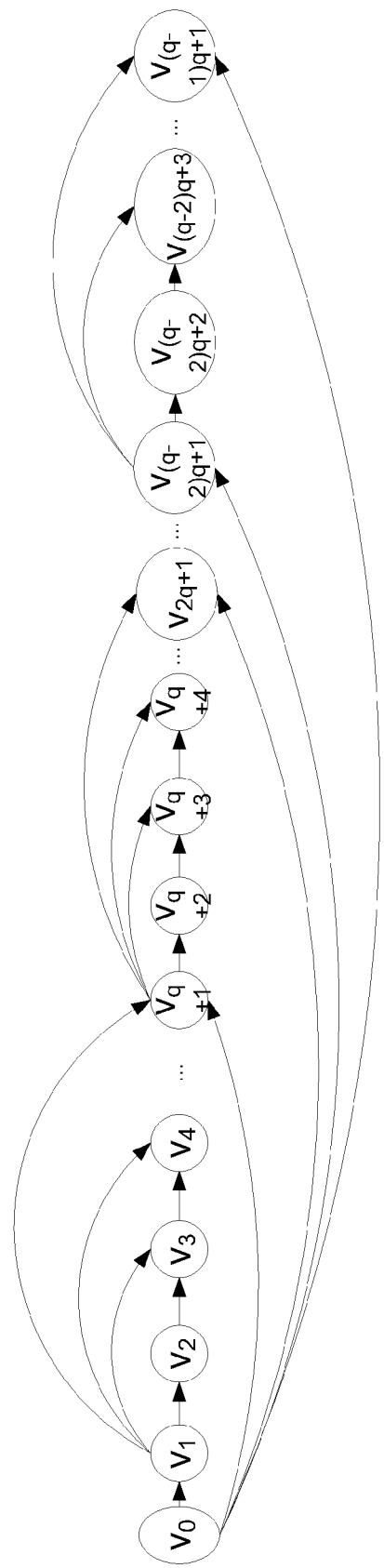
FIG. 13 illustrates yet another example graph corresponding to automatons for quantifications according to various embodiments of the invention.

In an example, Problem 2 is solved first. If the maximized path length, m, in not less than n, Problem 1 can be solved easily. The four solutions described below with reference to FIGS. 11-13 are derived from the scatter and merge patterns discussed with respect to FIGS. 4A-4C. The maximum length depends on the value of p and q.

In graph terms a scatter pattern can be described as an extension of a path with q vertices. Besides the edges comprising the original path, the starting vertex, v0, drives all the other vertices. The out-degree of v0 is q−1, vq−1 is 0, and the other vertices, v1 ... vq−2, are 1. The in-degree of v0 is 0, v1 is 1, and v2 ... vq−1 is 2. For all k, 1<=k<=q−1, there is a path of length k from v0 to vq−1.

k=1: v0->vq−1
k=2: v0->vq−2->vq−1
k=3: v0->vq−3->vq−2->vq−1
...
k=q−1: v0->v1->v2->...->vq−2->vq−1

Likewise, in graph terms, a merge pattern can be described as a path with p vertices. Besides the edges comprising the original path, the ending vertex, vp−1, is driven by all the other vertices. The in-degree of vp−1 is p−1, v0 is 0, and the other vertices, v1 ... vp−2, are 1. The out-degree of vp−1 is 0, vp−2 is 1, and v0 ... vp−3 is 2. For all k, 1<=k<=p−1, there is a path of length k from v0 to vp−1.

k=1: v0->vp−1
k=2: v0->v1->vp−1
k=3: v0->v1->v2->vp−1
...
k=q−1: v0->v1->v2->...->vp−2->vp−1

Figure 11A:
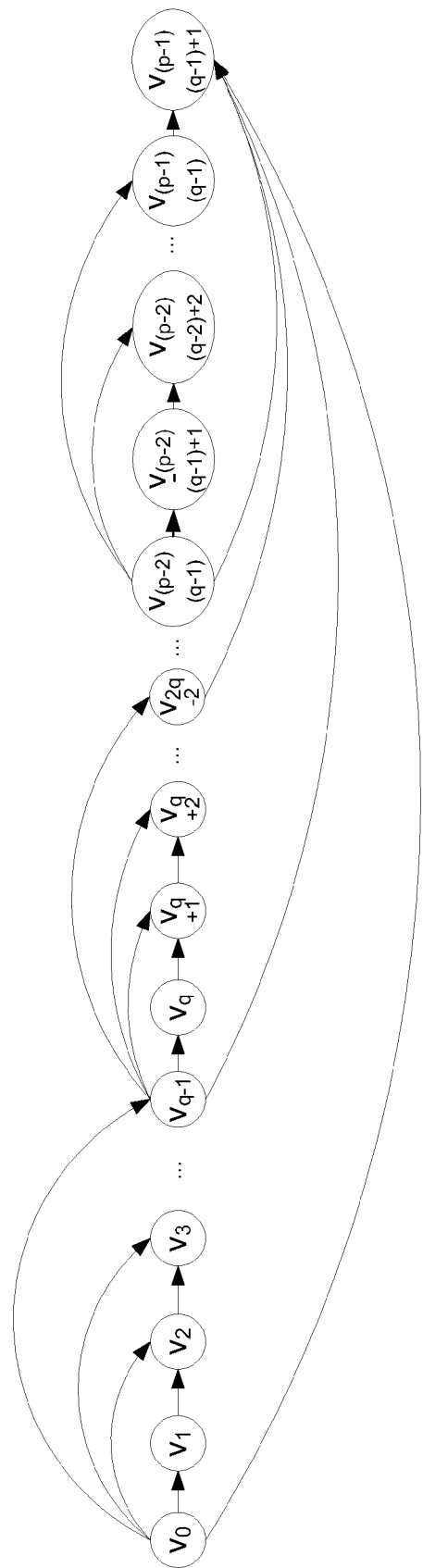
FIGS. 11A and 11B illustrate example graphs corresponding to automatons for quantifications according to various embodiments of the invention.

FIG. 11A illustrates a first solution for Problem 2 described above. The construction method is following. Concatenate p−1 copied of Scatter pattern of length q−1 and then add one more vertex, v(p−1)(q−1)+1, at the end. The ending and starting vertices of the scatter pattern are merged into one vertex during concatenation, denoted as junction vertices. Connect edges from all junction vertices to the last vertex, v(p−1)(q−1)+1. In fact, connecting junction vertices to v(p−1)(q−1)+1 is to apply Merge pattern on junction vertices.

Now, the out-degree of vertex, vk, is $$\begin{cases} q & k = x(q-1), 0 <= x <= p-2 \\ 0 & k = (p-1)(q-1)+1 \\ 1 & \text{others} \end{cases}$$

The in-degree of vertex, vk, is $$\begin{cases} 0 & k = 0 \\ 1 & k = x(q-1)+1, 0 <= x <= p-2 \\ p & k = (p-1)(q-1)+1 \\ 2 & \text{others} \end{cases}$$

For all k, 1<=k<=q, the path of length k from v0 to v(p−1)(q−1)+1 is
k=1: v0->v(p−1)(q−1)+1
k=2: v0->vq−1->v(p−1)(q−1)+1
k=3: v0->vq−2->vq−1->v(p−1)(q−1)+1
...
k=q: v0->v1->v2->...->vq−1->v(p−1)(q−1)+1

For all k, q+1<=k<=2q−1, the path of length k from v0 to v(p−1)(q−1)+1 is
k=q+1: v0->v1->v2->...->vq−1->v2q−2->v(p−1)(q−1)+1
k=q+2: v0->v1->v2->...->vq−1->v2q−1->v2q−2->v(p−1)(q−1)+1
k=q+3: v0->v1->v2->...->vq−1->v2q−2->vq−1->v2q−2->v(p−1)(q−1)+1
...
k=2q: v0->v1->v2->...->vq−1->vq->vq+1->...->v2q−2->v(p−1)(q−1)+1

For other k, 2q+1<=k<=(p−1)(q−1)+1, the paths are constructed similarly. Therefore, the achieved maximum path length of Solution 1 equals (p−1)(q−1)+1.

Figure 11B:
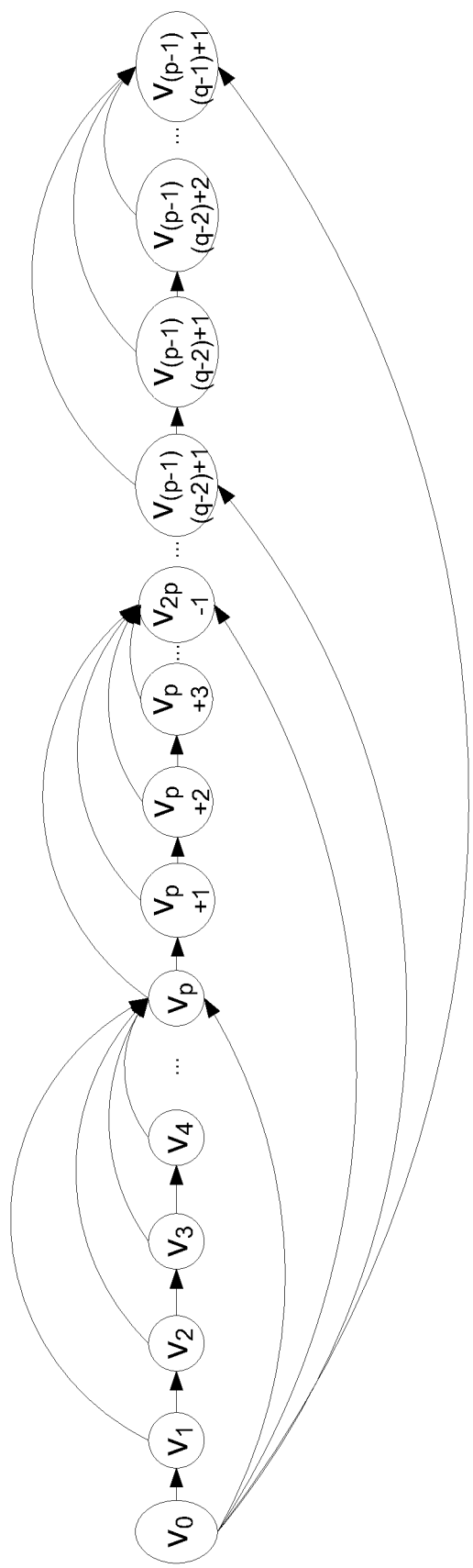

FIG. 11B illustrates a second solution to Problem 2 that is similar to the first solution above. In this solution the usage of Merge Pattern and Scatter Pattern are swapped with respect to the first solution to Problem 2. Basically, Merge Pattern is used for sub-path, and Scatter Patter is applied for junction vertices. The details about in-degree, out-degree, and paths of various lengths are similar as Solution 1. The achieved maximum path length of Solution 1 equals (p−1)(q−1)+1.

FIG. 12 illustrates a third solution to Problem 2. This solution is to apply Merge Pattern for both sub-paths and junction vertices. The achieved maximum path length of Solution 1 equals p(p−1)+1.

FIG. 13 illustrates a fourth solution to Problem 2. This solution is to apply Scatter Pattern for both sub-paths and junction vertices. The achieved maximum path length of Solution 1 equals q(q−1)+1.

Figure 14:
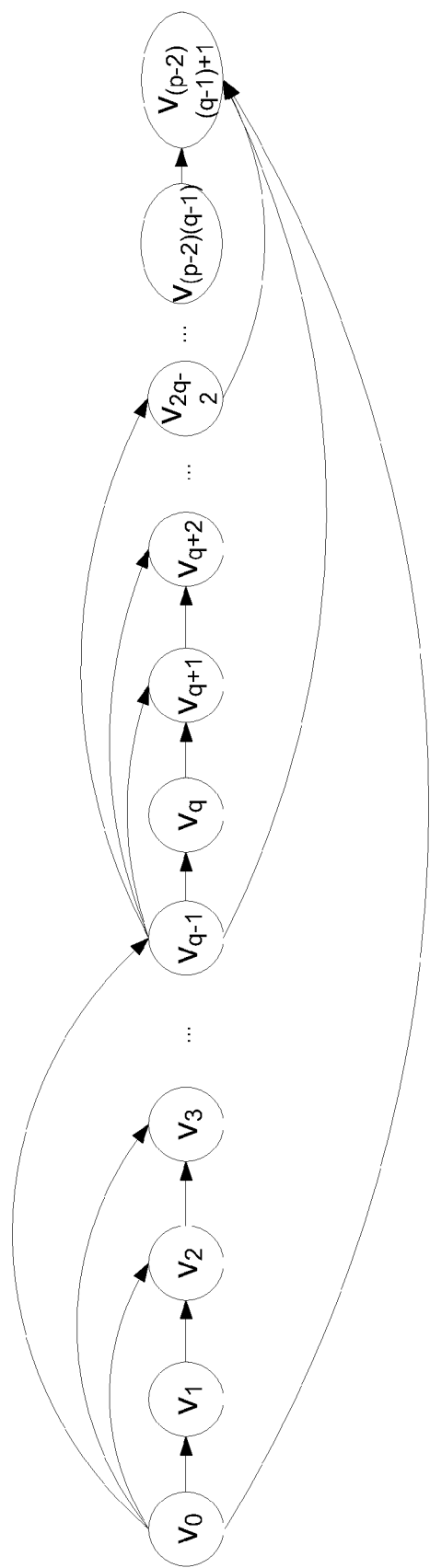
FIG. 14 illustrates still another example graph corresponding to automatons for quantifications according to various embodiments of the invention.

FIG. 14 illustrates a solution to Problem 1. Obtaining solution of Problem 1 from the above four solutions is straightforward. Take any solution whose maximum length is not less than n (the path length). Assume Solution 1 is taken and n equals (p−2)(q−1)+1. Remove vertices with index larger than (p−2)(q−1)+1, and then reconnect junction vertices to v(p−2)(q−1)+1. The resulted graph is the solution for Problem 1. The same technique applies to all of the four solutions to Problem 2.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, the code may be tangibly stored on one or more volatile or non-volatile computer-readable media during execution or at other times. These computer-readable media may include, but are not limited to, hard disks, removable magnetic disks, removable optical disks (e.g., compact disks and digital video disks), magnetic cassettes, memory cards or sticks, random access memories (RAMs), read only memories (ROMs), and the like.

FIG. 15 illustrates generally an example of a computer 1500 having a Von Nuemann architecture. Upon reading and comprehending the content of this disclosure, one of ordinary skill in the art will understand the manner in which a software program can be launched from a computer-readable medium in a computer-based system to execute the functions defined in the software program. One of ordinary skill in the art will further understand the various programming languages that can be employed to create one or more software programs designed to implement and perform the methods disclosed herein. The programs can be structured in an object-orientated format using an object-oriented language, such as Java, C++, or one or more other languages. Alternatively, the programs can be structured in a procedure-orientated format using a procedural language, such as assembly, C, etc. The software components can communicate using any of a number of mechanisms well known to those of ordinary skill in the art, such as application program interfaces or interprocess communication techniques, including remote procedure calls or others. The teachings of various embodiments are not limited to any particular programming language or environment.

Thus, other embodiments can be realized. For example, an article of manufacture, such as a computer, a memory system, a magnetic or optical disk, some other storage device, or any type of electronic device or system can include one or more processors 1502 coupled to a computer-readable medium 1522 such as a memory (e.g., removable storage media, as well as any memory including an electrical, optical, or electromagnetic conductor) having instructions 1524 stored thereon (e.g., computer program instructions), which when executed by the one or more processors 1502 result in performing any of the actions described with respect to the methods above.

The computer 1500 can take the form of a computer system having a processor 1502 coupled to a number of components directly, and/or using a bus 1508. Such components can include main memory 1504, static or non-volatile memory 1506, and mass storage 1516. Other components coupled to the processor 1502 can include an output device 1510, such as a video display, an input device 1512, such as a keyboard, and a cursor control device 1514, such as a mouse. A network interface device 1520 to couple the processor 1502 and other components to a network 1526 can also be coupled to the bus 1508. The instructions 1524 can further be transmitted or received over the network 1526 via the network interface device 1520 utilizing any one of a number of well-known transfer protocols (e.g., HTTP). Any of these elements coupled to the bus 1508 can be absent, present singly, or present in plural numbers, depending on the specific embodiment to be realized.

In an example, one or more of the processor 1502, the memories 1504, 1506, or the storage device 1516 can each include instructions 1524 that, when executed, can cause the computer 1500 to perform any one or more of the methods described herein. In alternative embodiments, the computer 1500 operates as a standalone device or can be connected (e.g., networked) to other devices. In a networked environment, the computer 1500 can operate in the capacity of a server or a client device in server-client network environment, or as a peer device in a peer-to-peer (or distributed) network environment. The computer 1500 can include a personal computer (PC), a tablet PC, a set-top box (STB), a Personal Digital Assistant (PDA), a cellular telephone, a web appliance, a network router, switch or bridge, or any device capable of executing a set of instructions (sequential or otherwise) that specify actions to be taken by that device. Further, while only a single computer 1500 is illustrated, the term "computer" shall also be taken to include any collection of devices that individually or jointly execute a set (or multiple sets) of instructions to perform any one or more of the methodologies discussed herein.

The computer 1500 can also include an output controller 1528 for communicating with peripheral devices using one or more communication protocols (e.g., universal serial bus (USB), IEEE 1394, etc.) The output controller 1528 can, for example, provide an image to a programming device 1530 that is communicatively coupled to the computer 1500. The programming device 1530 can be configured to program a parallel machine (e.g., parallel machine 500, FSM engine 600). In other examples, the programming device 1530 can be integrated with the computer 1500 and coupled to the bus 1508 or can communicate with the computer 1500 via the network interface device 1520 or another device.

While the computer-readable medium 1524 is shown as a single medium, the term "computer-readable medium" should be taken to include a single medium or multiple media (e.g., a centralized or distributed database, or associated caches and servers, and or a variety of storage media, such as the processor 1502 registers, memories 1504, 1506, and the storage device 1516) that store the one or more sets of instructions 1524. The term "computer-readable medium" shall also be taken to include any medium that is capable of storing, encoding or carrying a set of instructions for execution by the computer and that cause the computer to perform any one or more of the methodologies of the present invention, or that is capable of storing, encoding or carrying data structures utilized by or associated with such a set of instructions. The term "computer-readable medium" shall accordingly be taken to include, but not be limited to tangible media, such as solid-state memories, optical, and magnetic media.

The Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment.

EXAMPLE EMBODIMENTS

Example 1 includes a computer-implemented method including converting a quantification into an automaton, wherein converting includes unrolling the quantification to control an in-degree of the automaton; and converting the automaton into machine code corresponding to a target device.

Example 2 includes a computer-readable medium including instructions, which when executed by the computer, cause the computer to perform operations comprising converting a quantification into an automaton, wherein converting includes unrolling the quantification to control an out-degree of the automaton; and converting the automaton into machine code corresponding to a target device.

Example 3 includes a computer comprising a memory having software stored thereon; and a processor communicatively coupled to the memory. The software, when executed by the processor, causes the processor to convert a quantification into an automaton, wherein convert includes unroll the quantification to control an in-degree or an out-degree of the automaton; and convert the automaton into machine code corresponding to a target device.

Example 4 includes a system comprising a computer configured to: convert a quantification into an automaton, wherein convert includes unrolling the quantification to control an in-degree or an out-degree of the automaton; and convert the automaton into machine code corresponding to a target device.

Example 5 includes a computer-implemented method comprising converting a quantification into an automaton, wherein converting includes unrolling the quantification to control an out-degree of the automaton; and converting the automaton into machine code corresponding to a target device.

Example 6 includes a computer-readable medium including instructions, which when executed by the computer, cause the computer to perform operations comprising converting a quantification into an automaton, wherein converting includes unrolling the quantification to control an in-degree of the automaton; and converting the automaton into machine code corresponding to a target device.

In Example 7, the subject matter of any of Examples 1-6 can optionally include parsing an expression into a non-language specific representation including the quantification.

In Example 8, the subject matter of any of Examples 1-7 can optionally include wherein parsing an expression into a non-language specific representation comprises parsing a regular expression into a syntax tree.

In Example 9, the subject matter of any of Examples 1-8 can optionally include wherein converting includes, when a repeated expression for the quantification is nullable, unrolling the quantification as a quantification having a non-nullable form of the repeated expression that can be matched zero times.

In Example 10, the subject matter of any of Examples 1-9 can optionally include wherein converting the automaton into machine code comprises converting the automaton into an image configured to program a parallel machine.

In Example 11, the subject matter of any one of Examples 1-10 can optionally include publishing the image.

In Example 12, the subject matter of any of Examples 1-11 can optionally include wherein unrolling the quantification to control an in-degree of the automaton comprises unrolling the quantification as a function of an in-degree limitation.

In Example 13, the subject matter of any of Examples 1-12 can optionally include, wherein the in-degree limitation includes a limit on the number of transitions into a state of the automaton.

In Example 14, the subject matter of any of Examples 1-13 can optionally include wherein unrolling the quantification to control an in-degree of the automaton comprises unrolling based on an in-degree constraint of the target device.

In Example 15, the subject matter of any of Examples 1-14 can optionally include wherein the quantification is a regular expression.

In Example 16, the subject matter of any one of Examples 1-15 can optionally include wherein unrolling the quantification to control an in-degree of the automaton comprises unrolling the quantification to control an in-degree of the automaton based on a threshold.

In Example 17, the subject matter of any of Examples 1-16 can optionally include wherein the threshold is based on a hardware limitation of the parallel machine.

In Example 18, the subject matter of any of Examples 1-17 can optionally include wherein unrolling includes limiting the out-transitions for each state of the automaton to below a threshold number.

In Example 19, the subject matter of any of Examples 1-18 can optionally include wherein unrolling includes minimizing out-transitions for each state of the automaton.

In Example 20, the subject matter of any of Examples 1-19 can optionally include wherein converting includes, when a repeated expression for the quantification is nullable, unrolling the quantification as a quantification having a non-nullable form of the repeated expression that can be matched zero times.

In Example 21, the subject matter of any of Examples 1-20 can optionally include wherein converting includes when the quantification can be matched with a single number of loops, unrolling the quantification to form an automaton having states representing a number of expressions equal to the single number linked in series, wherein the expressions correspond to a repeated expression for the quantification.

In Example 22, the subject matter of any of Examples 1-21 can optionally include wherein when the quantification can be matched with a multiple number of loops, the multiple number of loops including a first number of loops, n1, and a second number of loops, n2, unrolling the quantification includes splitting the quantification into a first quantification that can be matched with the n1−1 number of loops and a second quantification that can be matched with from one to a n2−n1+1 number of loops.

In Example 23, the subject matter of any of Examples 1-22 can optionally include loading the image onto a parallel machine.

In Example 24, the subject matter of any of Examples 1-23 can optionally include storing the image on a computer readable medium.

In Example 25, the subject matter of any of Examples 1-24 can optionally include controlling the in-degree and out-degree by trading off in-transitions for out-transitions in the automaton.

In Example 26, the subject matter of any of Examples 1-25 can optionally include wherein the in-transitions for each state are limited to below a threshold number when unrolling.

In Example 27, the subject matter of any of Examples 1-26 can optionally include wherein the in-degree is limited to a ratio of the out-degree.

In Example 28, the subject matter of any of Examples 1-27 can optionally include wherein the in-degree is limited to the ratio of the out-degree until a threshold of in-transitions are reached for a state of the automaton.

In Example 29, the subject matter of any of Examples 1-28 can optionally include wherein the machine code comprises an image configured to program a parallel machine, and further comprising a device communicatively coupled to the computer and configured to load the image onto a parallel machine.

In Example 30, the subject matter of any of Examples 1-29 can optionally include wherein unrolling the quantification to control an in-degree of the automaton comprises unrolling the quantification as a function of an in-degree limitation.

In Example 31, the subject matter of any of Examples 1-30 can optionally include wherein the in-degree limitation includes a limit on the number of transitions into a state of the automaton.

In Example 32, the subject matter of any of Examples 1-31 can optionally include wherein unrolling the quantification to control an in-degree of the automaton comprises unrolling based on an in-degree constraint of the target device.

In Example 33, the subject matter of any of Examples 1-32 can optionally include wherein unrolling the quantification to control an in-degree of the automaton comprises unrolling the quantification to control an in-degree of the automaton based on a threshold.

In Example 34, the subject matter of any of Examples 1-33 can optionally include wherein the threshold is based on a hardware limitation of the parallel machine.

In Example 35, the subject matter of any of Examples 1-34 can optionally include parsing a regular expression into a syntax tree.

In Example 36, the subject matter of any of Examples 1-35 can optionally include wherein converting the automaton into machine code comprises converting the automaton into an image configured to program a parallel machine.

In Example 37, the subject matter of any one of Examples 1-36 can optionally include publishing the image.

In Example 38, the subject matter of any of Examples 1-37 can optionally include wherein unrolling the quantification to control an out-degree of the automaton comprises unrolling the quantification as a function of an out-degree limitation.

In Example 39, the subject matter of any of Examples 1-38 can optionally include wherein the out-degree limitation includes a limit on the number of transitions out of a state of the automaton.

In Example 40, the subject matter of any of Examples 1-39 can optionally include wherein unrolling the quantification to control an out-degree of the automaton comprises unrolling based on an out-degree constraint of the target device.

In Example 41, the subject matter of any of Examples 1-40 can optionally include wherein unrolling the quantification to control an out-degree of the automaton comprises unrolling the quantification to control an out-degree of the automaton based on a threshold.

In Example 42, the subject matter of any of Examples 1-41 can optionally include wherein the threshold is based on a hardware limitation of the parallel machine.

In Example 43, the subject matter of any of Examples 1-42 can optionally include wherein unrolling includes limiting the in-transitions for each state of the automaton to below a threshold number.

In Example 44, the subject matter of any of Examples 1-43 can optionally include wherein unrolling includes minimizing in-transitions for each state of the automaton.

In Example 45, the subject matter of any of Examples 1-44 can optionally include wherein converting includes, when a repeated expression for the quantification is nullable, unrolling the quantification as a quantification having a non-nullable form of the repeated expression that can be matched zero times.

In Example 46, the subject matter of any of Examples 1-45 can optionally include wherein converting includes when the quantification can be matched with a single number of loops, unrolling the quantification to form an automaton having states representing a number of expressions equal to the single number linked in series, wherein the expressions correspond to a repeated expression for the quantification.

In Example 47, the subject matter of any of Examples 1-46 can optionally include wherein when the quantification can be matched with a multiple number of loops, the multiple number of loops including a first number of loops, n1, and a second number of loops, n2, unrolling the quantification includes splitting the quantification into a first quantification that can be matched with the n1−1 number of loops and a second quantification that can be matched with from one to a n2−n1+1 number of loops.

Example 48 includes a parallel machine programmed by an image produced using the subject matter of any of Examples 1-47.

What is claimed is:

1. A machine-readable medium that is not a transitory propagating signal, the machine readable medium including instructions that, when executed by a machine, cause the machine to preform operations comprising:
   identifying a quantification in a regular expression of source code;
   rewriting the quantification to be implemented by at least one of a counter state machine element of a target device or a set of general purpose state machine elements;
   identifying portions of the rewritten quantification that can be implemented by the counter state machine element;
   determining whether the target device has an available counter state machine element for the identified portions; and
   unrolling the identified portions if there is no available counter state machine element and assigning the identified portions to the available counter state machine element otherwise.

2. The machine-readable medium of claim 1, wherein rewriting the quantification to be implemented by the counter state machine element includes putting a portion of the quantification into the form of a sub-expression and a range, the range including a first threshold denoting a minimum repetition of the sub-expression and a second threshold denoting a maximum repetition of the sub-expression, the first threshold being greater than zero and the second threshold being greater than or equal to the first threshold.

3. The machine-readable medium of claim 2, wherein rewriting the quantification includes splitting the quantification into a first portion that is bounded by the first threshold and the second threshold, and a second portion that is unbounded in at least one of the minimum repetition or the maximum repetition for a second sub-expression, wherein combining the first portion and the second portion matches the same pattern as the quantification.

4. The machine-readable medium of claim 1, wherein unrolling the identified portions includes:
   determining that the identified portions match a single number of loops; and
   repeating the sub-expression serially for the single number.

5. The machine-readable medium of claim 1, wherein unrolling the identified portions includes:
   determining that the identified portions match a multiple numbers of loops including at least a first number and a second number;
   creating a first new quantification of the first number minus one;
   creating a second new quantification with a ranged between one and the second number minus the first number plus one; and
   concatenating the result of repeating a sub-expression of the first new quantification for the first number minus one times to an unrolling of the second new quantification.

6. The machine-readable medium of claim 5, wherein the unrolling of the second new quantification includes splitting the second new quantification based on a threshold transitions states to members of the split, the threshold denoting in-degree or out-degree transitions of an automaton.

7. The machine-readable medium of claim 6, wherein the splitting includes creating sub-expressions for the sub-expression of the second new quantification.

8. A computer-implemented method comprising:
- identifying a quantification in a regular expression of source code;
- rewriting the quantification to be implemented by at least one of a counter state machine element of a target device or a set of general purpose state machine elements;
- identifying portions of the rewritten quantification that can be implemented by the counter state machine element;
- determining whether the target device has an available counter state machine element for the identified portions; and
- unrolling the identified portions if there is no available counter state machine element and assigning the identified portions to the available counter state machine element otherwise.

9. The method of claim 8, wherein rewriting the quantification to be implemented by the counter state machine element includes putting a portion of the quantification into the form of a sub-expression and a range, the range including a first threshold denoting a minimum repetition of the sub-expression and a second threshold denoting a maximum repetition of the sub-expression, the first threshold being greater than zero and the second threshold being greater than or equal to the first threshold.

10. The method of claim 9, wherein rewriting the quantification includes splitting the quantification into a first portion that is bounded by the first threshold and the second threshold, and a second portion that is unbounded in at least one of the minimum repetition or the maximum repetition for a second sub-expression, wherein combining the first portion and the second portion matches the same pattern as the quantification.

11. The method of claim 8, wherein unrolling the identified portions includes:
- determining that the identified portions match a single number of loops; and
- repeating the sub-expression serially for the single number.

12. The method of claim 8, wherein unrolling the identified portions includes:
- determining that the identified portions match a multiple numbers of loops including at least a first number and a second number;
- creating a first new quantification of the first number minus one;
- creating a second new quantification with a ranged between one and the second number minus the first number plus one; and
- concatenating the result of repeating a sub-expression of the first new quantification for the first number minus one times to an unrolling of the second new quantification.

13. The method of claim 12, wherein the unrolling of the second new quantification includes splitting the second new quantification based on a threshold transitions states to members of the split, the threshold denoting in-degree or out-degree transitions of an automaton.

14. The method of claim 13, wherein the splitting includes creating sub-expressions for the sub-expression of the second new quantification.

15. A computer comprising:
- a memory including instructions stored thereon; and
- a processor communicatively coupled to the memory when the computer is in operation, wherein the instructions, when executed by the processor, cause the processor to:
  - identify a quantification in a regular expression of source code;
  - rewrite the quantification to be implemented by at least one of a counter state machine element of a target device or a set of general purpose state machine elements;
  - identify portions of the rewritten quantification that can be implemented by the counter state machine element;
  - determine whether the target device has an available counter state machine element for the identified portions; and
  - unroll the identified portions if there is no available counter state machine element and assigning the identified portions to the available counter state machine element otherwise.

16. The computer of claim 15, wherein to rewrite the quantification to be implemented by the counter state machine element includes putting a portion of the quantification into the form of a sub-expression and a range, the range including a first threshold denoting a minimum repetition of the sub-expression and a second threshold denoting a maximum repetition of the sub-expression, the first threshold being greater than zero and the second threshold being greater than or equal to the first threshold.

17. The computer of claim 16, wherein to rewrite the quantification includes splitting the quantification into a first portion that is bounded by the first threshold and the second threshold, and a second portion that is unbounded in at least one of the minimum repetition or the maximum repetition for a second sub-expression, wherein combining the first portion and the second portion matches the same pattern as the quantification.

18. The computer of claim 15, wherein to unroll the identified portions includes the processor to:
- determine that the identified portions match a single number of loops; and
- repeat the sub-expression serially for the single number.

19. The computer of claim 15, wherein unrolling the identified portions includes the processor to:
- determine that the identified portions match a multiple numbers of loops including at least a first number and a second number;
- create a first new quantification of the first number minus one;
- create a second new quantification with a ranged between one and the second number minus the first number plus one; and
- concatenate the result of repeating a sub-expression of the first new quantification for the first number minus one times to an unrolling of the second new quantification.

20. The computer of claim 19, wherein unrolling the second new quantification includes splitting the second new quantification based on a threshold transitions states to members of the split, the threshold denoting in-degree or out-degree transitions of an automaton.

* * * * *